(12) United States Patent
Cok

(10) Patent No.: US 9,215,798 B2
(45) Date of Patent: Dec. 15, 2015

(54) IMPRINTED MULTI-LAYER MICRO-STRUCTURE METHOD WITH MULTI-LEVEL STAMP

(71) Applicant: Ronald Steven Cok, Rochester, NY (US)

(72) Inventor: Ronald Steven Cok, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 69 days.

(21) Appl. No.: 14/012,173

(22) Filed: Aug. 28, 2013

(65) Prior Publication Data

US 2015/0060393 A1    Mar. 5, 2015

(51) Int. Cl.
| | | |
|---|---|---|
| *H01B 13/00* | (2006.01) | |
| *H05K 1/02* | (2006.01) | |
| *H05K 3/46* | (2006.01) | |
| *H05K 3/12* | (2006.01) | |
| *H05K 3/00* | (2006.01) | |
| *H05K 1/09* | (2006.01) | |

(52) U.S. Cl.
CPC ............ *H05K 1/0274* (2013.01); *H05K 1/0298* (2013.01); *H05K 3/0041* (2013.01); *H05K 3/1258* (2013.01); *H05K 3/1275* (2013.01); *H05K 3/1283* (2013.01); *H05K 3/1291* (2013.01); *H05K 3/4685* (2013.01); *H05K 1/097* (2013.01); *H05K 3/12* (2013.01); *H05K 3/465* (2013.01); *H05K 2201/0979* (2013.01); *H05K 2201/09209* (2013.01); *H05K 2201/09281* (2013.01); *H05K 2201/09845* (2013.01); *H05K 2203/0108* (2013.01)

(58) Field of Classification Search
CPC ......... H05K 3/12; H05K 3/07; H05K 3/1258; H05K 3/1283; H05K 1/0287; H05K 1/029; H05K 1/0296; H05K 1/0298; H05K 1/0274
USPC ........... 216/13, 16, 17, 18, 19, 39, 40, 41, 48, 216/51, 54; 438/717, 720, 737, 738
See application file for complete search history.

(56) References Cited

U.S. PATENT DOCUMENTS

| | | | |
|---|---|---|---|
| 7,202,179 B2 | 4/2007 | Taussig et al. | |
| 8,179,381 B2 | 5/2012 | Frey et al. | |
| 8,704,106 B2 * | 4/2014 | Mizukoshi et al. | ........... 174/262 |
| 2004/0028875 A1 * | 2/2004 | Van Rijn et al. | ................ 428/98 |
| 2006/0267198 A1 * | 11/2006 | Lin et al. | ....................... 257/750 |

(Continued)

FOREIGN PATENT DOCUMENTS

CN    102063951    7/2013

*Primary Examiner* — Lan Vinh
(74) *Attorney, Agent, or Firm* — Raymond L. Owens

(57) ABSTRACT

A method of making an imprinted micro-wire structure includes providing a substrate, a first stamp, and a different multi-level second stamp. A curable bottom layer is provided over the substrate. One or more bottom-layer micro-channel(s) are imprinted in the curable bottom layer with the first stamp and a bottom-layer micro-wire formed in each bottom-layer micro-channel. A curable multi-layer is formed adjacent to and in contact with the cured bottom layer. First and second multi-layer micro-channels and a top-layer micro-channel are imprinted in the curable multi-layer with the multi-level second stamp. Either two bottom-layer micro-wires are electrically connected through the first and second multi-layer micro-wires and a top-layer micro-wire or two top-layer micro-wires are electrically connected through the first and second multi-layer micro-wires and a bottom-layer micro-wire.

18 Claims, 50 Drawing Sheets

(56) References Cited

U.S. PATENT DOCUMENTS

| | | |
|---|---|---|
| 2010/0026664 A1 | 2/2010 | Geaghan |
| 2010/0328248 A1 | 12/2010 | Mozdzyn |
| 2011/0007011 A1 | 1/2011 | Mozdzyn |
| 2011/0063776 A1* | 3/2011 | Byrne et al. ................. 361/323 |
| 2011/0099805 A1 | 5/2011 | Lee |
| 2011/0102370 A1 | 5/2011 | Kono et al. |

* cited by examiner

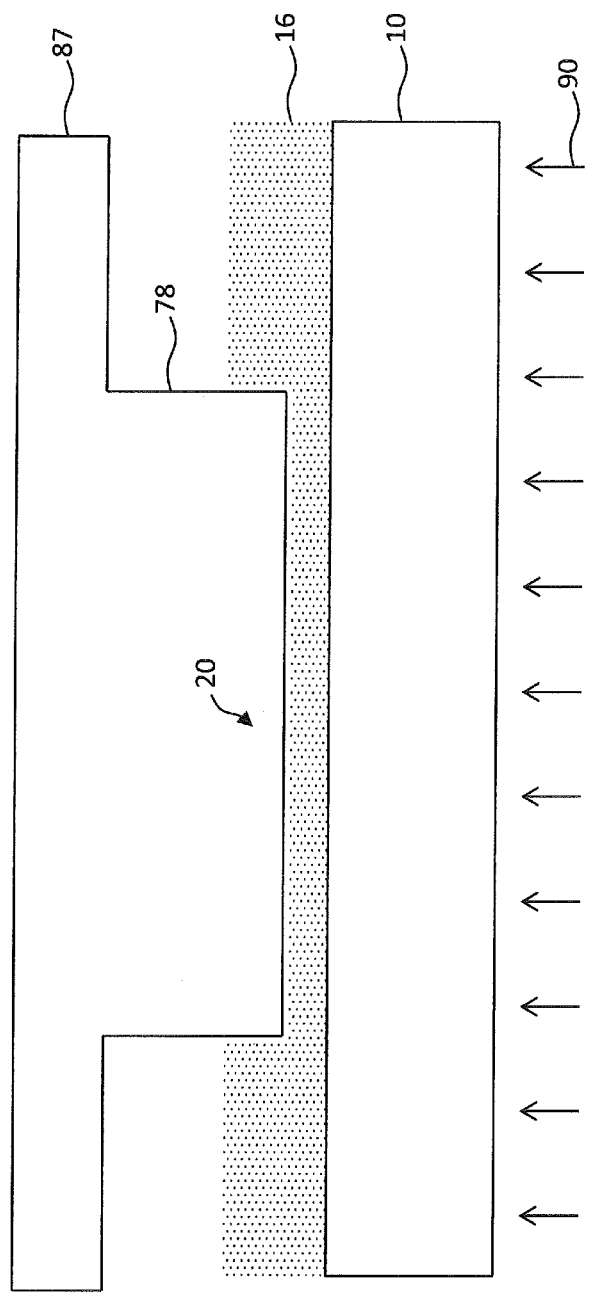

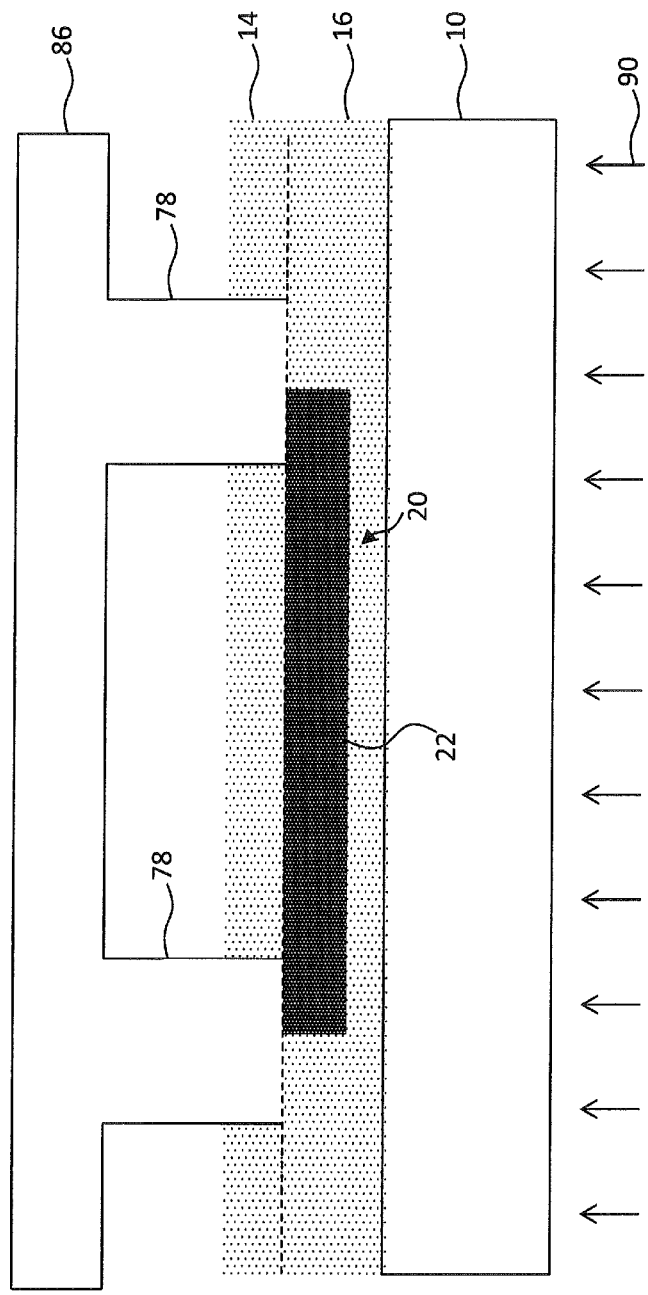

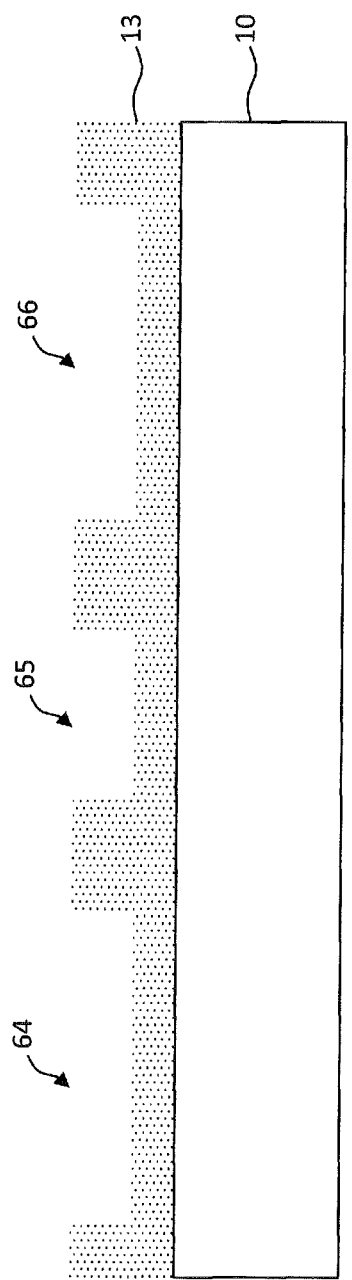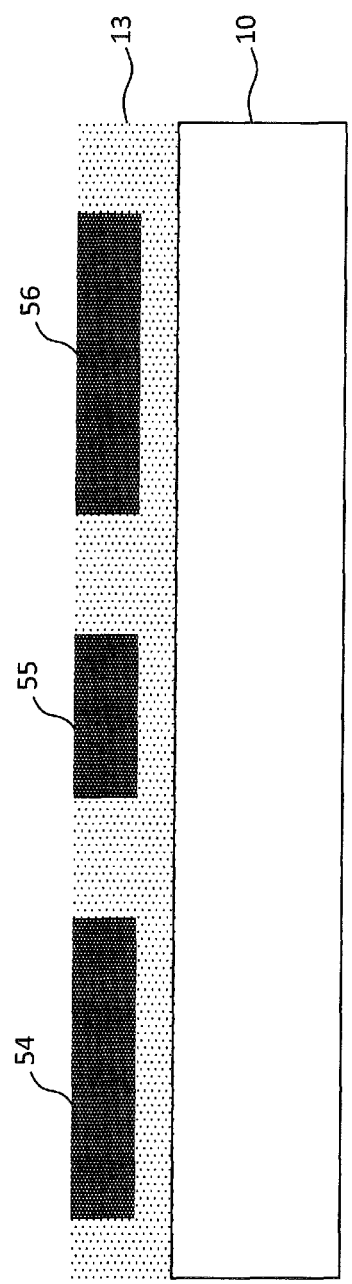
FIG. 10D
FIG. 10E

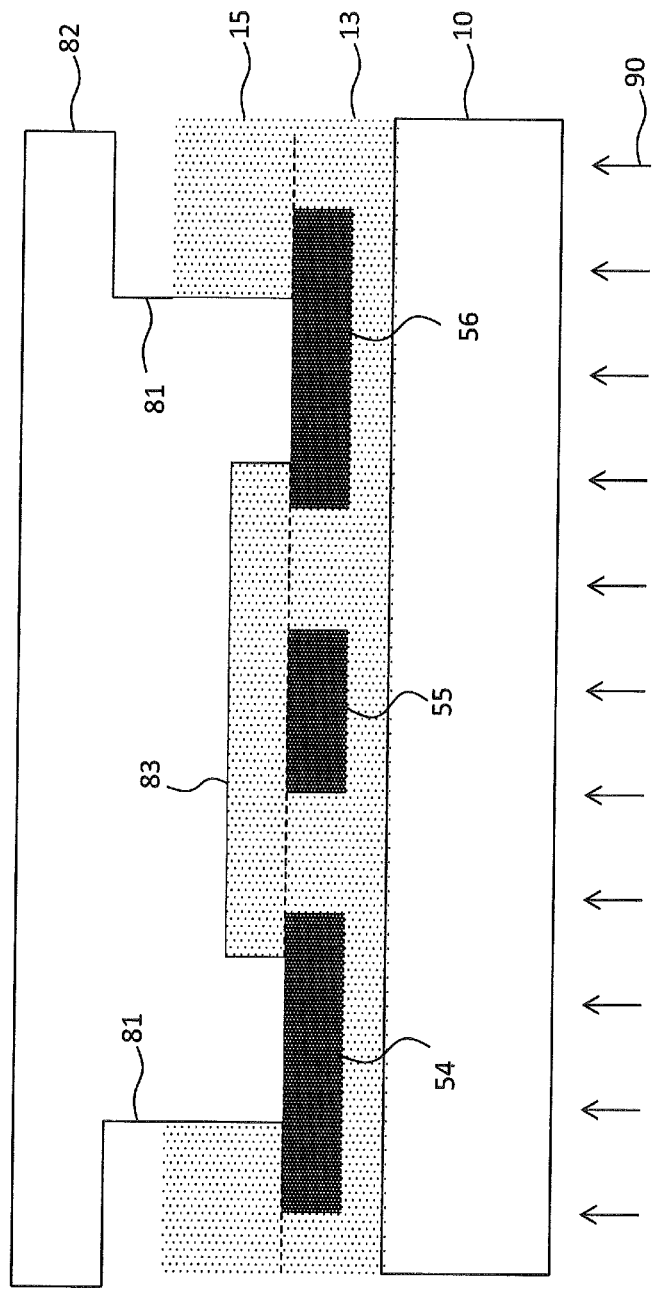

IMPRINTED MULTI-LAYER MICRO-STRUCTURE METHOD WITH MULTI-LEVEL STAMP

CROSS REFERENCE TO RELATED APPLICATIONS

Reference is made to commonly-assigned, U.S. patent application Ser. No. 14/012,150 filed Aug. 28, 2013, now U.S. Pat. No. 8,932,474, entitled "Imprinted Multi-Layer Micro-Structure Method" by Cok; commonly-assigned, U.S. patent application Ser. No. 14/012,195 filed Aug. 28, 2013, entitled "Imprinted Multi-Layer Micro-Structure" by Cok; and commonly-assigned, U.S. patent application Ser. No. 14/012,240 filed Aug. 28, 2013, entitled "Imprinted Bi-Layer Micro-Structure Method with Bi-Level Stamp" by Cok, the disclosures of which are all incorporated herein.

Reference is made to commonly assigned U.S. patent application Ser. No. 13/862,679, filed Apr. 15, 2013, entitled "Hybrid Single-Side Touch Screen Method" by Burberry et al; and commonly assigned U.S. patent application Ser. No. 13/784,869, filed Mar. 5, 2013, now U.S. Pat. No. 8,845,869 entitled "Micro-Channel Structure with Variable Depths" by Cok, the disclosures of which are incorporated herein.

FIELD OF THE INVENTION

The present invention relates to transparent electrodes having electrically conductive micro-wires formed in multiple layers.

BACKGROUND OF THE INVENTION

Transparent electrical conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays.

In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass. For example, the use of transparent conductive oxides to form arrays of touch sensors on one side of a substrate is taught in U.S. Patent Publication 2011/0099805 entitled "Method of Fabricating Capacitive Touch-Screen Panel".

Transparent conductive metal oxides are increasingly expensive and relatively costly to deposit and pattern. Moreover, the substrate materials are limited by the electrode material deposition process (e.g. sputtering) and the current-carrying capacity of such electrodes is limited, thereby limiting the amount of power that can be supplied to the pixel elements. Although thicker layers of metal oxides or metals increase conductivity, they also reduce the transparency of the electrodes.

Transparent electrodes, including very fine patterns of conductive elements, such as metal wires or conductive traces are known. For example, U.S. Patent Publication No. 2011/0007011 teaches a capacitive touch screen with a mesh electrode, as do U.S. Patent Publication No. 2010/0026664, U.S. Patent Publication No. 2010/0328248, and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. In particular, micro-replication is used to form micro-conductors formed in micro-replicated channels. The transparent micro-wire electrodes include micro-wires between 0.5μ and 4μ wide and a transparency of between approximately 86% and 96%.

Conductive micro-wires can be formed in micro-channels embossed in a substrate, for example as taught in CN102063951, which is hereby incorporated by reference in its entirety. As discussed in CN102063951, a pattern of micro-channels can be formed in a substrate using an embossing technique. Embossing methods are generally known in the prior art and typically include coating a curable liquid, such as a polymer, onto a rigid substrate. A pattern of micro-channels is embossed (impressed) onto the polymer layer by a master having an inverted pattern of structures formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example using patterned radiation exposure or physical masks. Unwanted material (e.g. photosensitive resist) is removed, followed by electro-deposition of metallic ions in a bath.

Conductive micro-wires are used to form a touch switch, for example as illustrated in U.S. Patent Publication 2011/0102370. In this example, a capacitive touch switch includes a first substrate on which is formed a first mesh-like electrode and a second substrate on which is formed a second mesh-like electrode. The first and second substrates are integrally bonded via an adhesive layer in such a manner that the first and second mesh-like electrodes face each other. Such a design requires the use of two substrates that are aligned and bonded together.

Multi-level masks are used with photo-lithography to form thin-film devices, for example as disclosed in U.S. Pat. No. 7,202,179. An imprinted 3D template structure is provided over multiple thin films formed on a substrate. The multiple levels of the template structure are used as masks for etching the thin films. This approach requires the use of a mask and multiple photo-lithographic steps.

There is a need, therefore, for further improvements in micro-wire structures for transparent electrodes that simplifies manufacturing steps and provides more complex and interconnected patterns.

SUMMARY OF THE INVENTION

In accordance with the present invention, a method of making an imprinted micro-structure comprises:

provide a substrate;

providing a first stamp and a different multi-level second stamp having at least first and second deep protrusions and one or more third shallow protrusions, the first and second deep protrusions having a depth greater than a depth of the shallow protrusion(s);

providing a curable bottom layer over the substrate;

forming one or more bottom-layer micro-channel(s) in the curable bottom layer by at least imprinting the curable bottom layer with the first stamp and curing the curable bottom layer;

forming a bottom-layer micro-wire in each bottom-layer micro-channel; providing a curable multi-layer adjacent to and in contact with the cured bottom layer;

forming at least first and second multi-layer micro-channels and a top-layer micro-channel in the curable multi-layer by at least imprinting the curable multi-layer with the multi-level second stamp and curing the curable multi-layer, wherein either:

i) the first multi-layer micro-channel formed by the first deep protrusion is located over at least a portion of a first bottom-layer micro-wire, a second multi-layer micro-channel formed by the second deep protrusion is located over at least a portion of a second bottom-layer micro-wire, and the top-layer micro-channel formed by the third shallow protrusion extends over at least a portion of a third bottom-layer micro-wire without contacting the third bottom-layer micro-wire; or ii) the first multi-layer micro-channel formed by the first deep protrusion is located over at least a portion of a bottom-layer micro-wire, a second multi-layer micro-channel formed by the second deep protrusion is located over at least a different portion of the bottom-layer micro-wire, and the top-layer micro-channel formed by the third shallow protrusion extends over at least a portion of the bottom-layer micro-wire without contacting the bottom-layer micro-wire;

forming a top-layer micro-wire in the top-layer micro-channel, a first multi-layer micro-wire in the first multi-layer micro-channel, and a second multi-layer micro-wire in the second multi-layer micro-channel that electrically connects the first multi-layer micro-wire to the second multi-layer micro-wire.

The present invention provides micro-wire structures with improved complexity, connectivity, and manufacturability. The micro-wires of the present invention are particularly useful in transparent electrodes for capacitive touch screen and display devices.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIGS. 9A-9M are cross sections illustrating sequential steps in a method of the present invention that forms the multi-wire structure of FIG. 3;

FIGS. 10A-10I are cross sections illustrating sequential steps in an alternative method of the present invention that forms the multi-wire structure of FIG. 1;

The Figures are not drawn to scale since the variation in size of various elements in the Figures is too great to permit depiction to scale.

DETAILED DESCRIPTION OF THE INVENTION

The present invention is directed toward imprinted multi-layer micro-wire structures having electrically conductive micro-wires formed in micro-channel structures in multiple layers over a substrate Imprinted structures are also known to those skilled in the art as embossed or impressed structures formed by locating an imprinting, impressing, or embossing stamp in a curable layer, curing the layer, and then removing the stamp to form micro-channels that are then filled with a conductive ink that is cured to form micro-wires.

Figure 1:
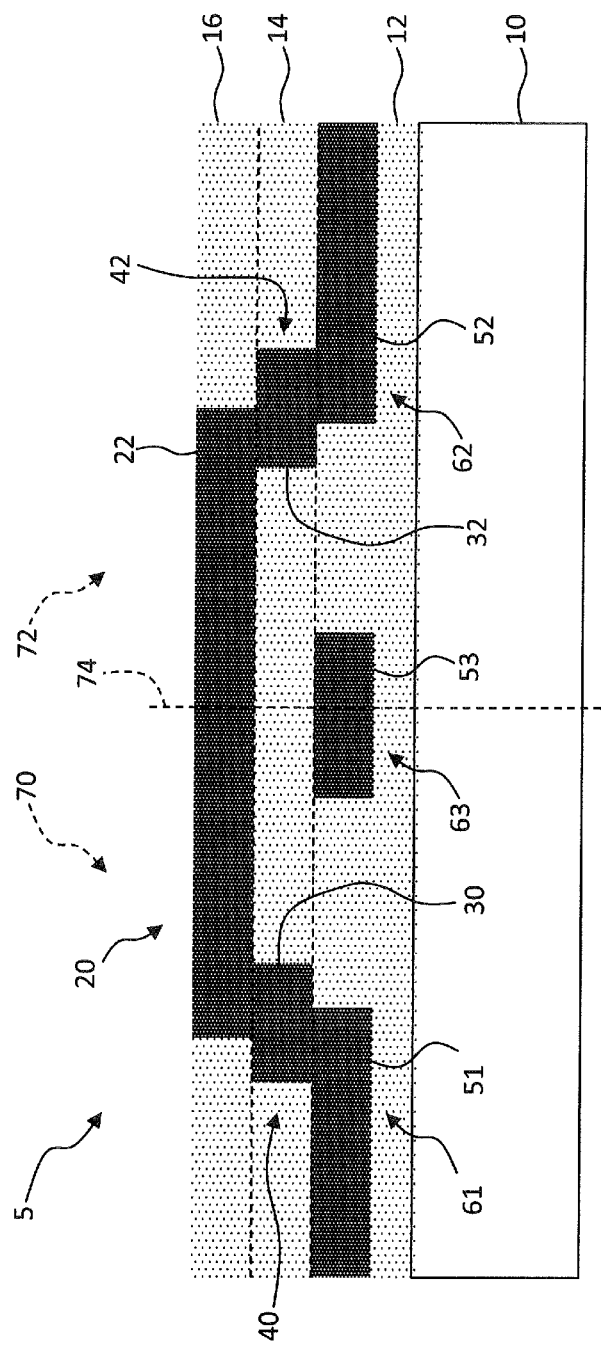
FIG. 1 is a cross section of an embodiment of the present invention.
Figure 2:
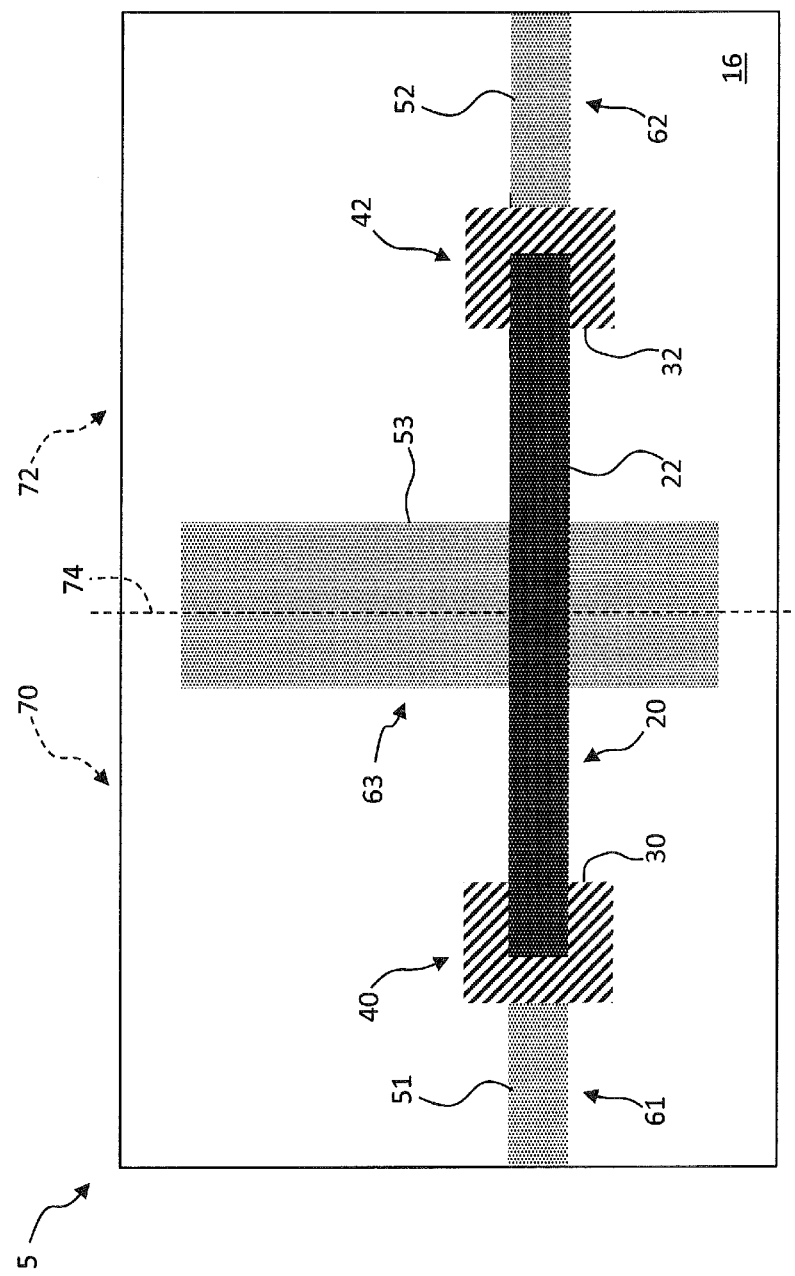
FIG. 2 is a plan view of the embodiment of the present invention corresponding to FIG. 1.
Figure 3:
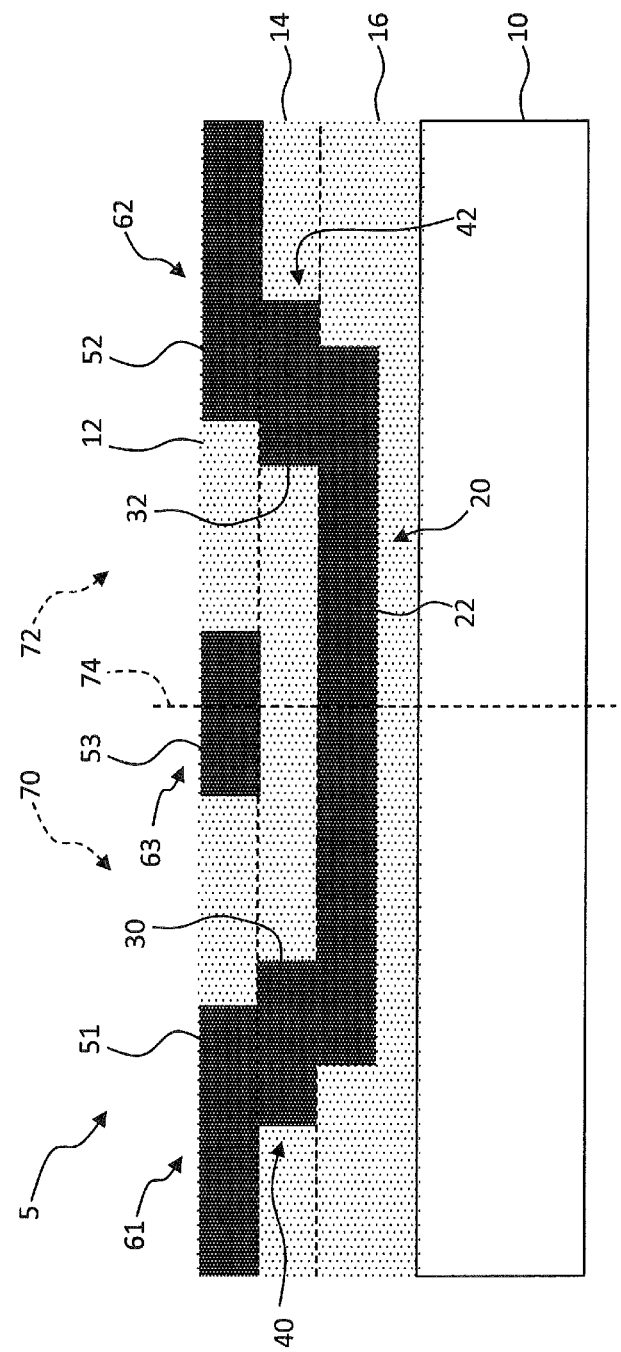
FIG. 3 is a cross section of another embodiment of the present invention.
Figure 4:
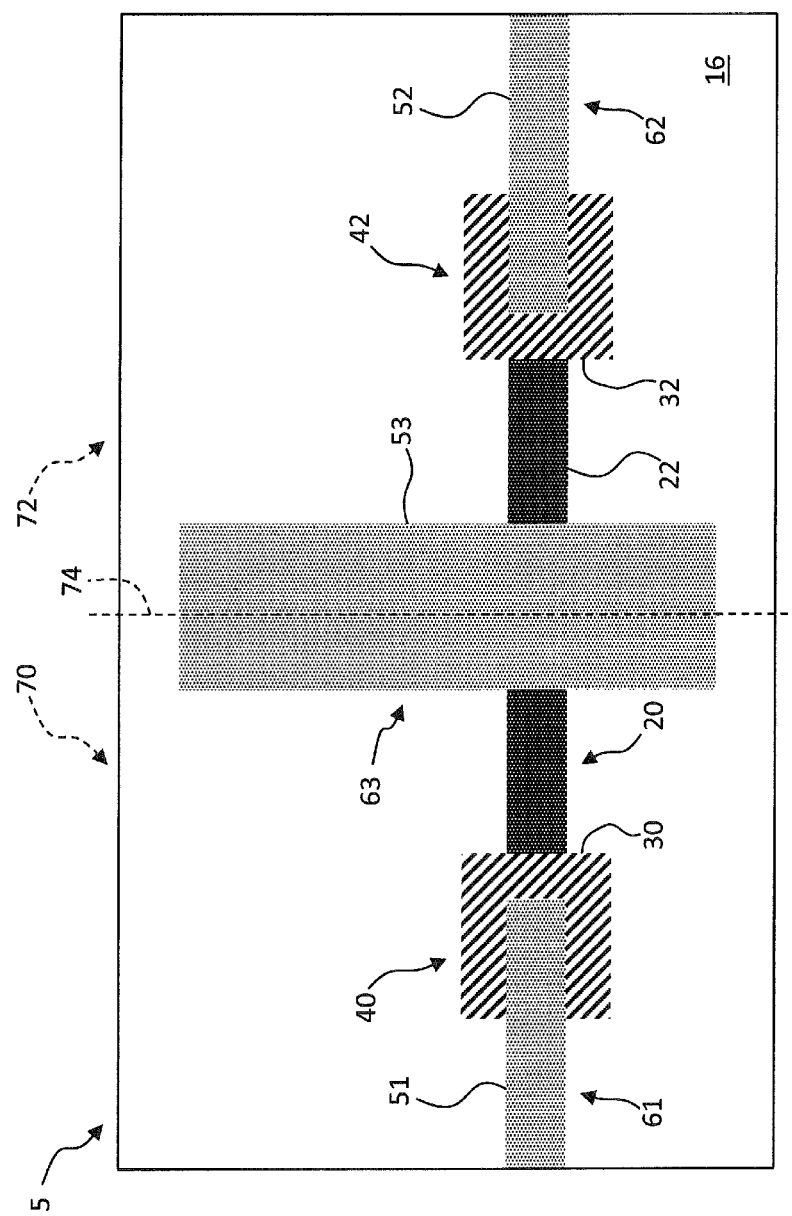
FIG. 4 is a plan view of the embodiment of the present invention corresponding to FIG. 3.

Referring to FIGS. 1 and 3 in cross section and to FIGS. 2 and 4 in plan view, according to an embodiment of the present invention an imprinted micro-wire structure 5 includes a substrate 10 with a first layer 12, a second layer 14, and a third layer 16 formed in relation to the substrate 10. The second layer 14 is between the first layer 12 and the third layer 16 so that the second layer 14 is adjacent to and in contact with the first layer 12 and the second layer 14 is adjacent to and in contact with the third layer 16.

First, second, and third micro-channels 61, 62, 63 are imprinted in the first layer 12. The third micro-channel 63 is separate from the first and second micro-channels 61, 62 and divide the first layer 12 into first and second portions 70, 72. The first micro-channel 61 is located in the first portion 70, and the second micro-channel 62 is located in the second portion 72. For purposes of clarity in illustration, FIGS. 1-4 includes a line 74 located in correspondence to the third micro-channel 63 that divides the first layer 12 into the first and second portions 70, 72. A first micro-wire 51 is located in the first micro-channel 61 in the first portion 70, a second micro-wire 52 is located in the second micro-channel 62 in the second portion 72, and a third micro-wire 53 is located in the third micro-channel 63.

An imprinted first connecting micro-channel 40 is in contact with at least a portion of the first micro-wire 51 and an imprinted second connecting micro-channel 42 is in contact with at least a portion of the second micro-wire 52. The first and second connecting micro-channels 40, 42 are in the second layer 14 and are not in contact with the third micro-channel 63 or the third micro-wire 53. A first connecting micro-wire 30 is located in the first connecting micro-channel 40 contacting at least a portion of the first micro-wire 51 and is separate from the third micro-wire 53. A second connecting micro-wire 32 is located in the second connecting micro-channel 42 contacting at least a portion of the second micro-wire 52 and is also separate from the third micro-wire 53.

An imprinted bridge micro-channel 20 is in the third layer 16 contacting at least a portion of the first connecting micro-wire 30, contacting at least a portion of the second connecting micro-wire 32, and is separate from the third micro-wire 53. A bridge micro-wire 22 is located in the bridge micro-channel 20. The bridge micro-wire 22 electrically connects the first micro-wire 51 to the second micro-wire 52 through the first and second connecting micro-wires 30, 32 and is electrically isolated from the third micro-wire 53.

Micro-wires illustrated in the Figures are formed in micro-channels and are therefore not readily distinguished in the illustration. For clarity, the micro-channels in which the micro-wires are formed are labeled with corresponding numbered arrows pointing to the micro-channels; the micro-wires formed in the corresponding micro-channels are labeled with numbered lead lines touching the micro-wires.

Referring specifically to the embodiment of FIGS. 1 and 2, the substrate 10 is adjacent to the first layer 12 so that the first, second and third micro-wires 51, 52, and 53 are formed in a layer adjacent to the substrate 10 and the bridge micro-wire 22 is formed in a layer farther from the substrate 10. In such an embodiment, the first layer 12 and the first, second, and third micro-wires 51, 52, 53 are formed corresponding to and in this embodiment are on or over the substrate 10, the second layer 14 and the first and second connecting micro-wires 30, 32 are formed corresponding to and in this embodiment are on or over the first layer 12 and the first, second, and third micro-wires 51, 52, 53, and the third layer 16 and the bridge micro-wire 22 are formed corresponding to and in this embodiment are on or over the second layer 14 and the first and second connecting micro-wires 30, 32. In an embodiment, the first layer 12 and first, second, and third micro-wires 51, 52, 53 are formed first, then the second layer 14 and first and second connecting micro-wires 30, 32 are formed, and then the third layer 16 and bridge micro-wire 22 are formed.

Alternatively, referring specifically to the embodiment of FIGS. 3 and 4, the substrate 10 is adjacent to the third layer 16 so that the bridge micro-wire 22 is formed in a layer adjacent to the substrate 10 and the first, second, and third micro-wires 51, 52, 53 are formed in a layer farther from the substrate 10. In such an embodiment, the third layer 16 and the bridge micro-wire 22 are formed corresponding to and in this embodiment are on or over the substrate 10, the second layer 14 and first and second connecting micro-wires 30, 32 are formed corresponding to and in this embodiment are on or over the third layer 16 and the bridge micro-wire 22, and the first layer 12 and the first, second, and third micro-wires 51, 52, 53 are formed corresponding to and in this embodiment are on or over the second layer 14 and first and second connecting micro-wires 30, 32. In an embodiment, the third layer 16 and bridge micro-wire 22 are formed first, then the second layer 14 and the first and second connecting micro-wires 30, 32 are formed, and then the third layer 16 and first, second, and third micro-wires 51, 52, 53 are formed.

In various embodiments of the present invention, the first, second, or third layers 12, 14, 16 include common materials or are formed from common materials. In an embodiment, the first, second, or third layers 12, 14, and 16 are not distinguishable apart from the micro-channels or micro-wires formed within the first, second, or third layers 12, 14, and 16. Thus, the first layer 12 and second layer 14 form a common layer, or the second layer 14 and the third layer 16 form a common layer, or the first, second, and third layers 12, 14, and 16 form a common layer. In a useful embodiment, the first layer 12 is cross linked to the second layer 14, the second layer 14 is cross linked to the third layer 16, or the first, second, and third layers 12, 14, and 16 are cross linked to each other. In an embodiment, the first layer 12, the second layer 14, and the third layer 16 are cured layers. For example the first, second, and third layers 12, 14, and 16 are cured layers formed from a curable polymer that includes cross-linking agents.

In further embodiments of the present invention, the first micro-wire 51, the second micro-wire 52, the third micro-wire 53, the first connecting micro-wire 30, the second connecting micro-wire 32, or the bridge micro-wire 22 is a cured micro-wire, for example, a cured conductive ink. In an embodiment, a common conductive ink is used for any of the first micro-wire 51, second micro-wire 52, third micro-wire 53, first connecting micro-wire 30, second connecting micro-wire 32, or bridge micro-wire 22 so that they include common materials or are formed from common materials. Useful cured conductive inks can include electrically conductive particles, for example silver nano-particles that are sintered, welded, or agglomerated together.

In an embodiment, the first connecting micro-wire 30 and the first micro-wire 51 are a common micro-wire so that electrically conductive particles in the first micro-wire 51 are sintered, welded, or agglomerated to electrically conductive particles in the first connecting micro-wire 30. Such a structure is formed if the first micro-wire 51 and the first connecting micro-wire 30 are coated as a curable conductive ink and cured in a common step. Alternatively, the second connecting micro-wire 32 and the second micro-wire 52 are a common micro-wire so that electrically conductive particles in the second micro-wire 52 are sintered, welded, or agglomerated to electrically conductive particles in the second connecting micro-wire 32, or both. Such a structure is formed if the second micro-wire 52 and the second connecting micro-wire 32 are coated as a curable conductive ink and cured in a common step.

In an embodiment, the first connecting micro-wire 30, the second connecting micro-wire 32, and the bridge micro-wire 22 are a common micro-wire so that electrically conductive particles in the bridge micro-wire 22 are sintered, welded, or agglomerated to electrically conductive particles in the first connecting micro-wire 30 and second connecting micro-wire 32. Such a structure is formed if the first connecting micro-wire 30, the second connecting micro-wire 32, and the bridge micro-wire 22 are coated as a conductive ink and cured in a common step.

Figure 5A:
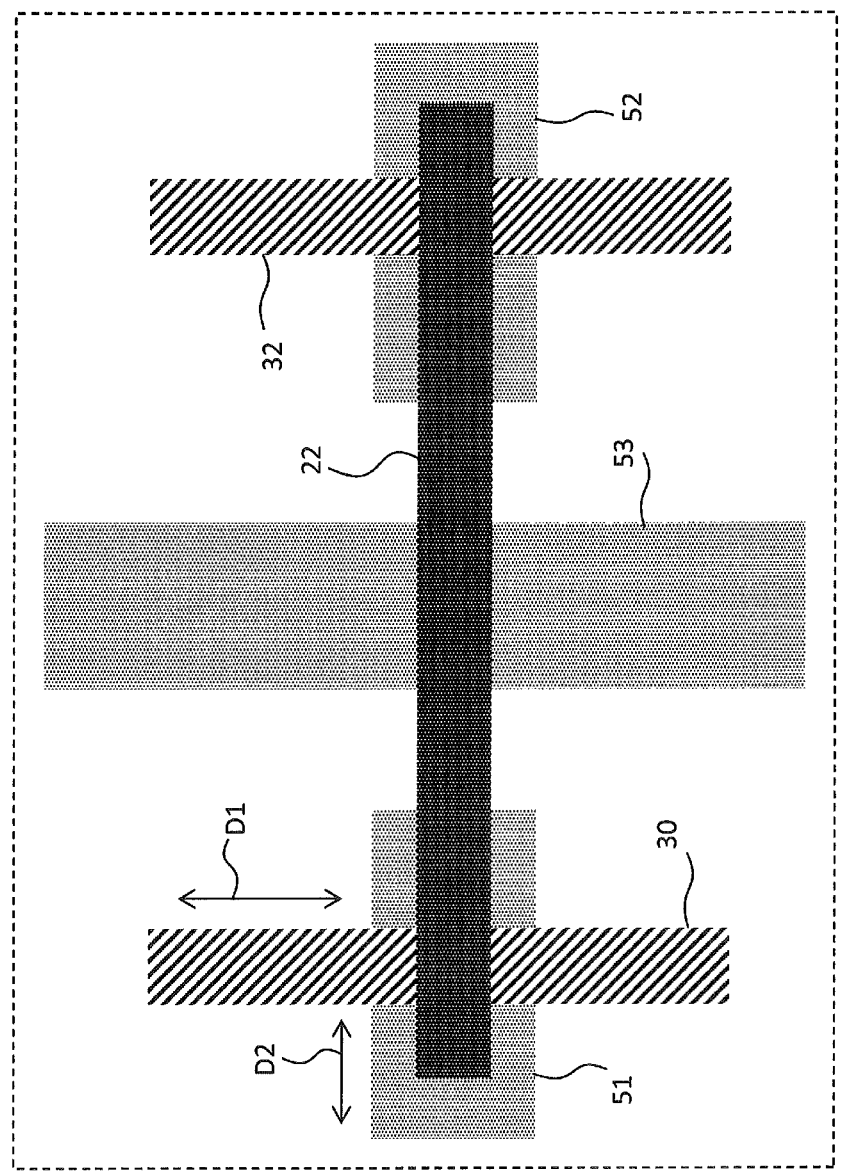
FIGS. 5A-5D are plan views illustrating various embodiments of the present invention having micro-wires with portions that extend primarily in different directions.

Referring next to FIGS. 5A-5D, structures useful for enabling electrical contact between micro-wires in different layers are illustrated. Referring first to FIG. 5A, a portion of the bridge micro-wire 22 extends primarily in a direction D2 different from the direction D1 in which at least a portion of the first or second connecting micro-wires 30, 32 primarily extend. In some embodiments, the direction D2 in which at least a portion of the bridge micro-wire 22 primarily extends is orthogonal to the direction D1 in which at least a portion of the first or second connecting micro-wires 30, 32 primarily extend. Alternatively or in addition and as is also illustrated in FIG. 5A, at least a portion of the first connecting micro-wire 30 extends primarily in a direction D1 different from the direction D2 in which at least a portion of the first micro-wire 51 primarily extends. Alternatively or in addition, at least a portion of the second connecting micro-wire 52 extends primarily in a direction D1 different from the direction D2 in which at least a portion of the second micro-wire 52 primarily extends. The third micro-wire 53 typically extends in a direction different from that of the first and second micro-wires 51, 52, for example in direction D1.

By primarily extends is meant that for micro-wires that have an aspect ratio other than one for a portion of the micro-wire, for example rectangular, non-square micro-wires, the longer side of the micro-wire portion has an edge that extends in the primary direction of the micro-wire portion. Alternatively, most micro-wires are long and narrow; the length direction of the micro-wire is the direction in which the micro-wire primarily extends.

Figure 5B:
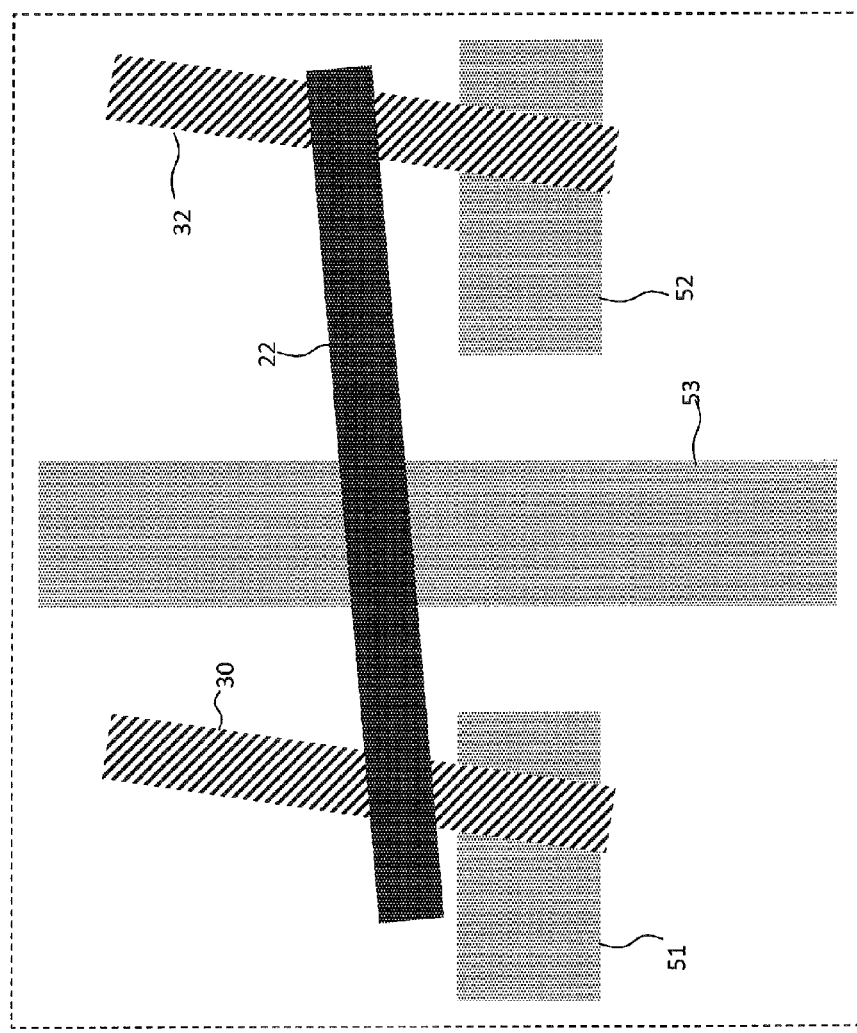

The structure in FIG. 5A is useful in preventing problems with electrical connectivity between micro-wires in different layers caused by registration or alignment tolerance requirements by extending the region over which a micro-wire in one layer can electrically contact a micro-wire in another layer. This reduces the alignment tolerance requirements for the location of micro-wires in different layers. For example, referring to FIG. 5B, if the first and second connecting micro-wires 30, 32, bridge micro-wire 22, or the first, second, and third micro-wires 51, 52, 53 are mis-aligned with respect to each other, electrical contact is still made between the bridge micro-wire 22 and the first, second, and third micro-wires 51, 52, 53. As shown in FIG. 5B, the first and second connecting micro-wires 30, 32 are mis-aligned with respect to the first, second, and third micro-wires 51, 52, 53, and the bridge micro-wire 22 is mis-aligned with respect to the first and second connecting micro-wires 30, 32. Despite this mis-alignment, the first and second micro-wires 51, 52 are electrically connected, as desired.

Figure 5C:
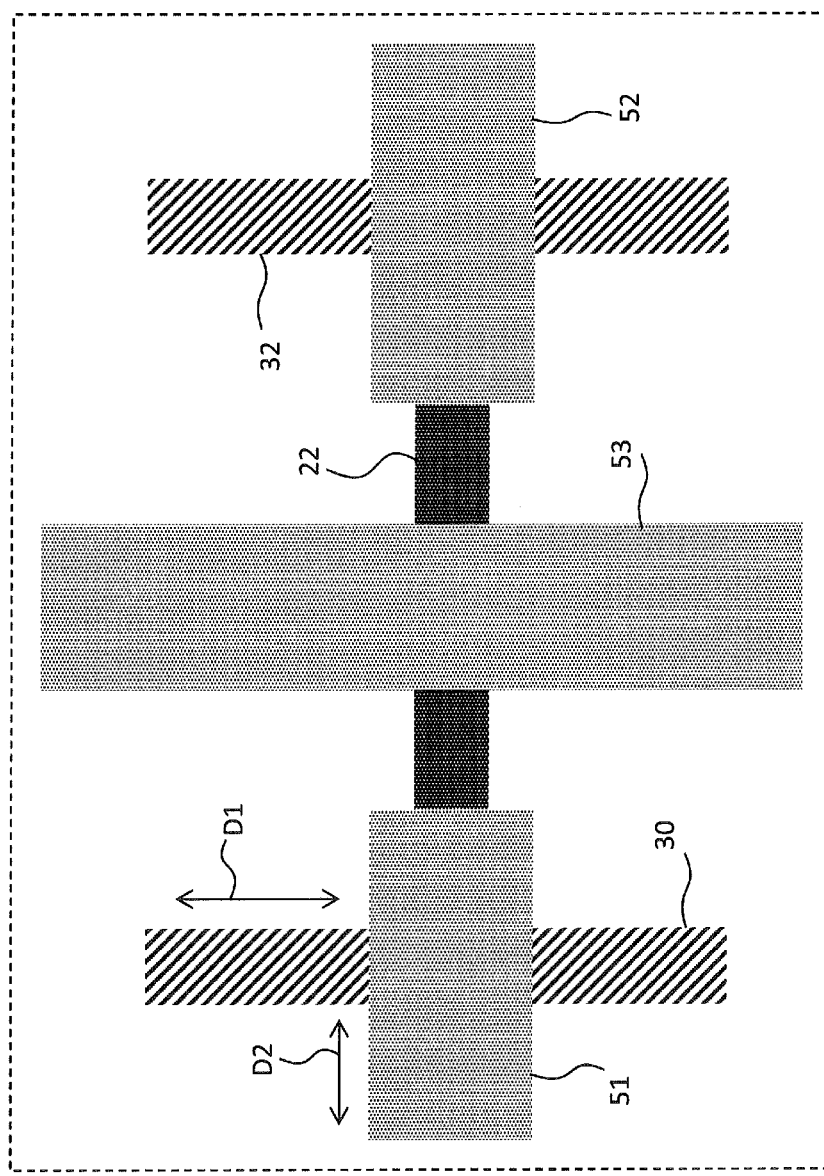

The structure of FIGS. 5A and 5B correspond to that illustrated in FIGS. 1 and 2 with the first, second, and third micro-wires 51, 52, 53 adjacent to the substrate 10. Referring to FIG. 5C, the bridge micro-wire 22 is adjacent to the substrate 10 as shown in FIGS. 3 and 4. In both the structures of FIG. 5A and that of FIG. 5C, the first and second connecting micro-wires 30, 32 are between the bridge micro-wire 22 and the first, second, and third micro-wires 51, 52, 53. The first and second micro-wires 51, 52 and bridge micro-wire 22 extend in direction D2 and the first and second connecting micro-wires 30, 32 extend in direction D1, as in FIG. 5A.

Figure 5D:
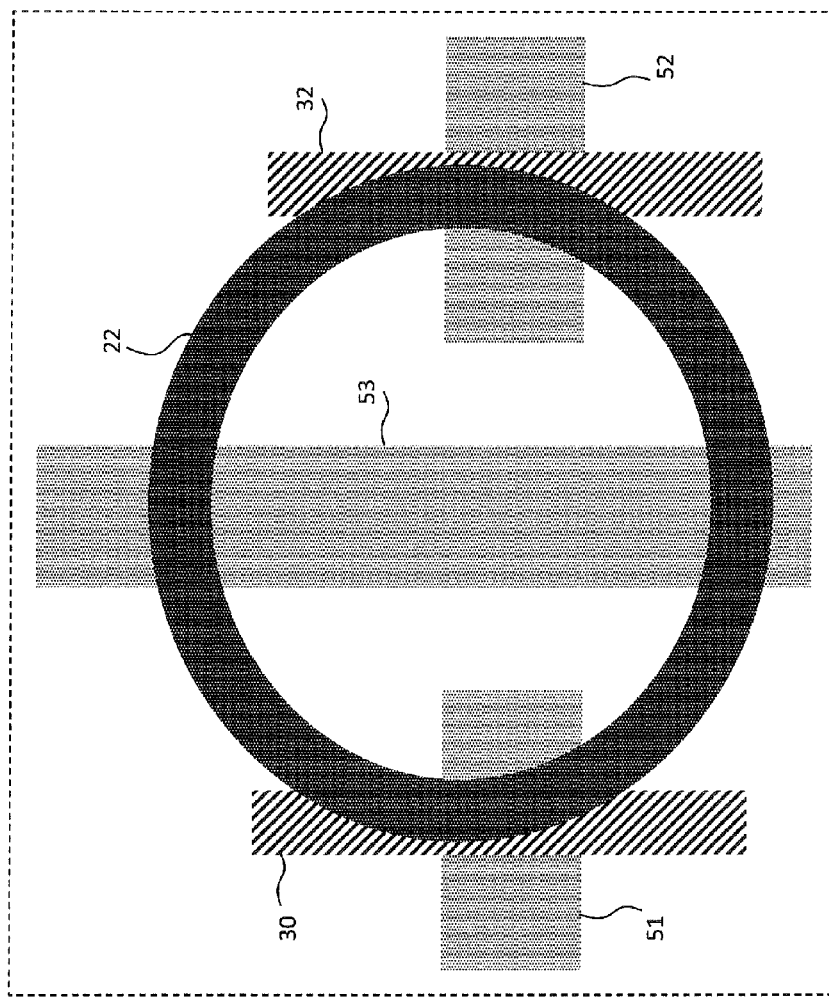

Referring to FIG. 5D, imprinted micro-wire structures 5 of the present invention are not limited to rectangles. As illustrated in FIG. 5D, the bridge micro-wire 22 is a ring that contacts the first and second connecting micro-wires 30, 32 and thus electrically connect the first and second micro-wires, 51, 52 and electrically isolates the third micro-wire 53.

Figure 6:
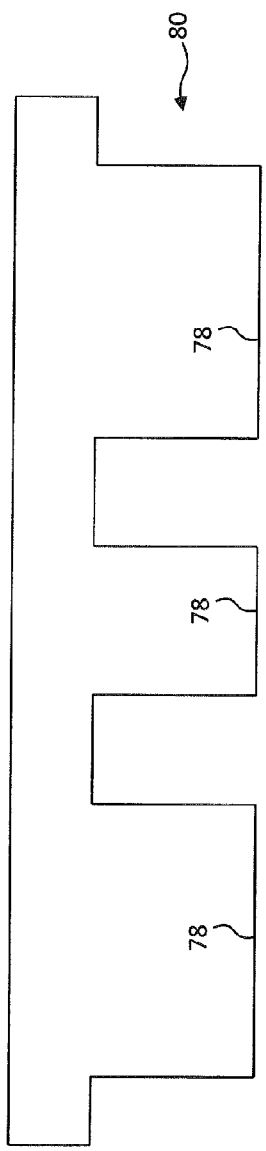
FIG. 6 is a cross section illustrating an imprinting stamp useful in a method of the present invention.
Figure 8A:
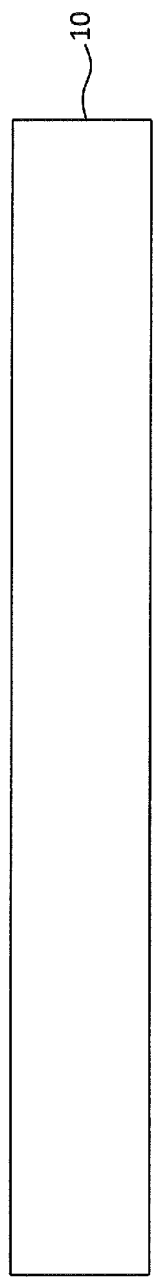
FIGS. 8A-8M are cross sections illustrating sequential steps in a method of the present invention that forms the multi-wire structure of FIG. 1.
Figure 8B:
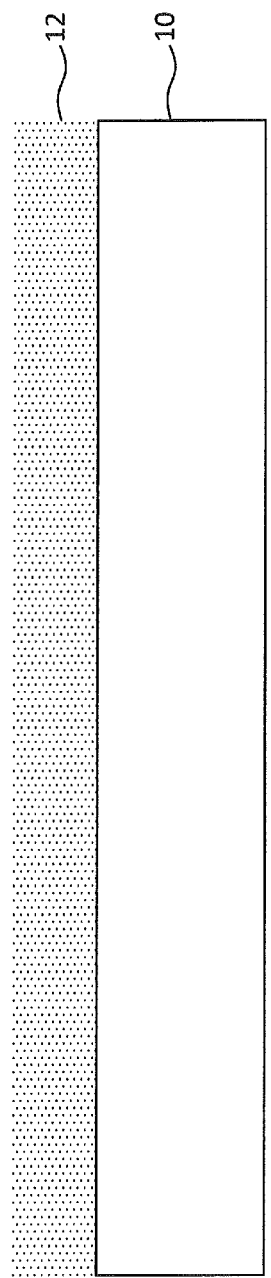
Figure 13:
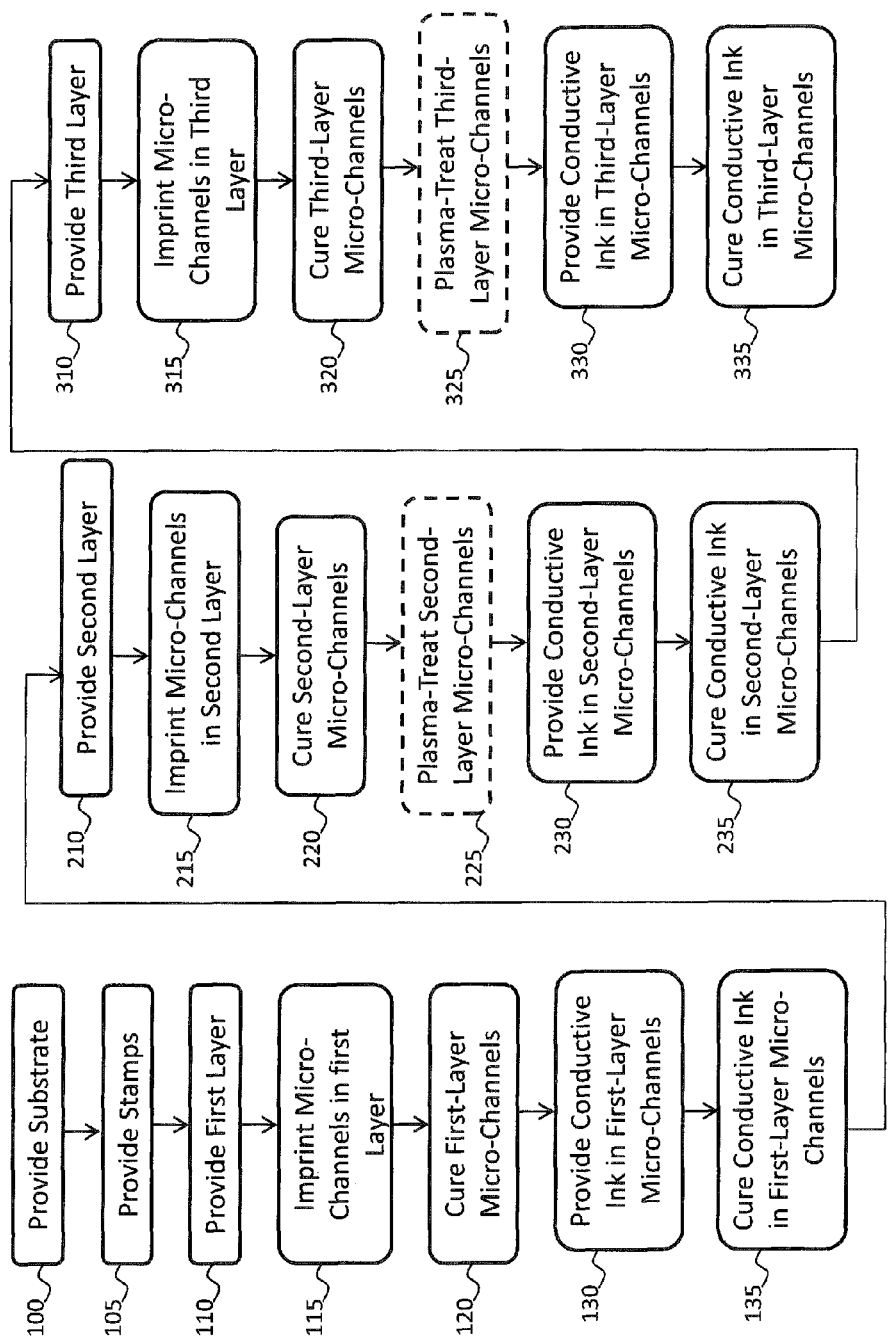
FIG. 13 is a flow diagram illustrating an embodiment of the present invention corresponding to the cross sections of FIGS. 8A-8M.

Referring to FIG. 13 and to FIGS. 8A-8M, in a method of the present invention, a substrate 10 as illustrated in FIG. 8A is provided in step 100. First, second, and third stamps are provided in step 105. Referring also to FIG. 6, a first stamp 80 has protrusions 78 that, when located in a curable layer form micro-channels. In step 110 and as illustrated in FIG. 8B, a curable first layer 12 is provided in relation to the substrate 10, for example by coating a layer of curable material on the substrate 10 or on layers formed on the substrate 10.

Figure 8C:
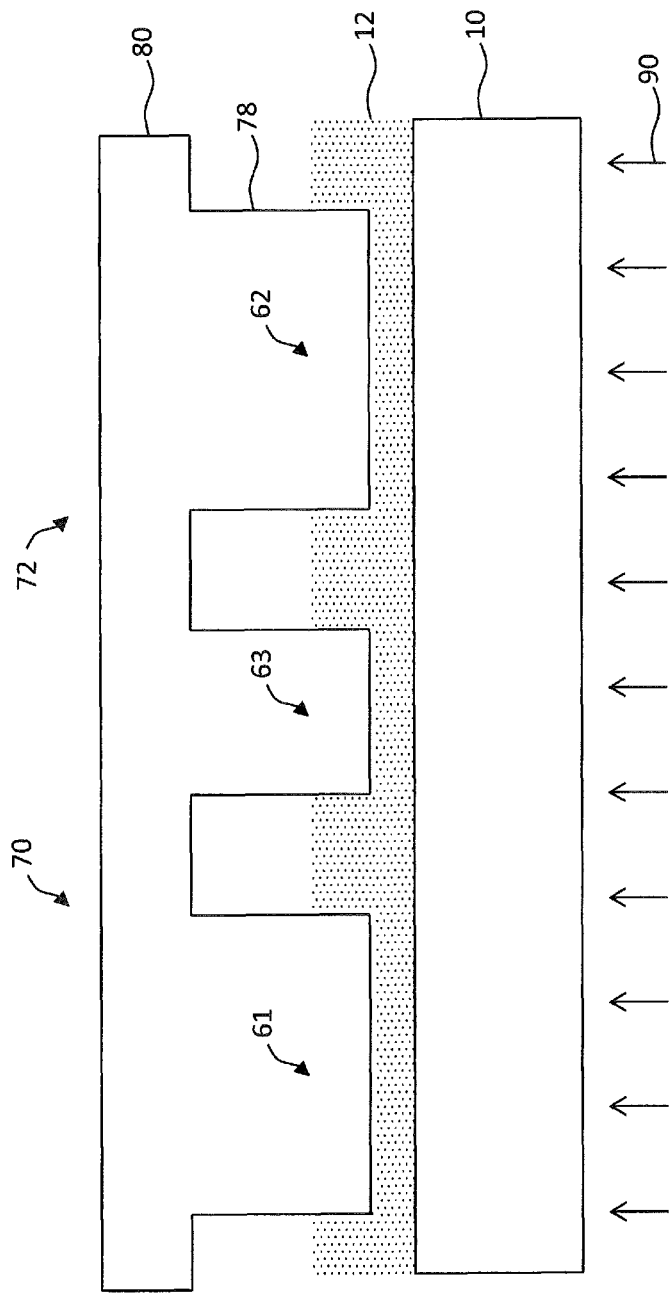

Referring next to FIG. 8C, first, second, and third micro-channels 61, 62, 63 are formed in the curable first layer 12 by at least imprinting the curable first layer 12 with the first stamp 80 located so that protrusions 78 extend into the curable first layer 12 over the substrate 10 in step 115. The third micro-channel 63 is separate from the first and second micro-channels 61, 62 so that the third micro-channel 63 divides the first layer 12 into first and second portions 70, 72. The first micro-channel 61 is located in the first portion 70 and the second micro-channel 62 is located in the second portion 72. The curable first layer 12 is cured, for example with radiation 90, in step 120 and the first stamp 80 is removed from the cured first layer 12 (FIG. 8D) so that the first, second, and third micro-channels 61, 62, 63 are formed in the cured first layer 12 over the substrate 10.

Figure 8D:
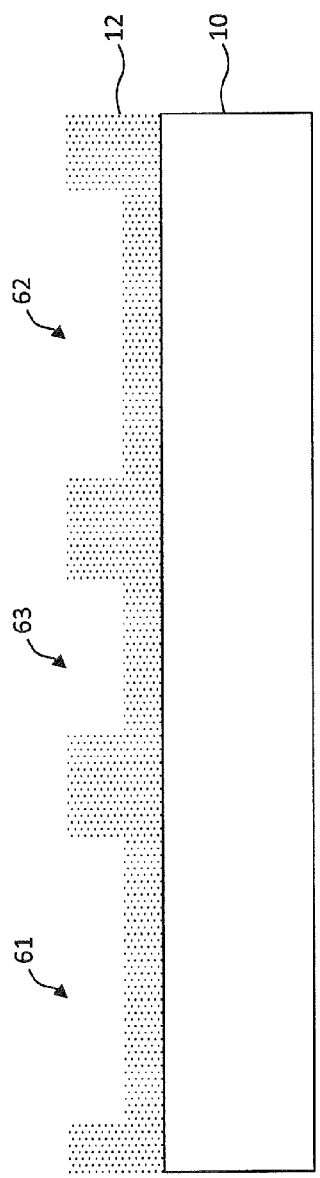
Figure 8E:
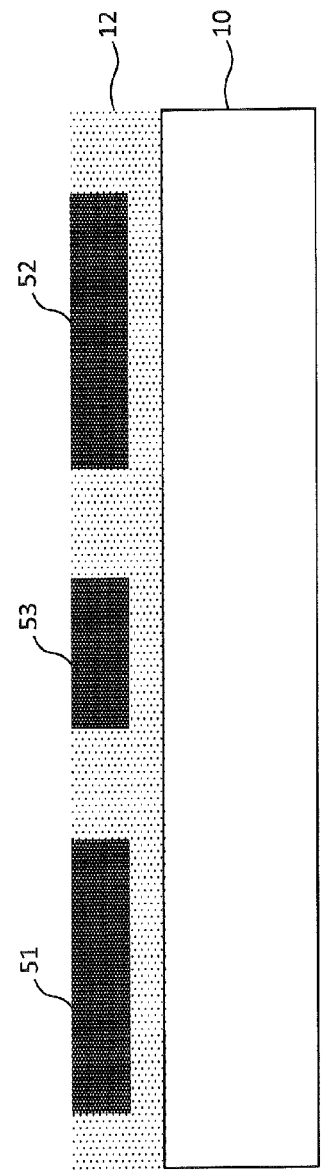

A conductive ink is provided in the first, second, and third micro-channels 61, 62, 63 in step 130, for example by coating the cured first layer 12 with conductive ink and wiping excess conductive ink from the surface of the cured first layer 12. The conductive ink is cured in step 135 to form a first micro-wire 51 in the first micro-channel 61, a second micro-wire 52 in the second micro-channel 62, and a third micro-wire 53 in the third micro-channel 63 in cured first layer 12 over substrate 10, as illustrated in FIGS. 8D and 8E.

Figure 8F:
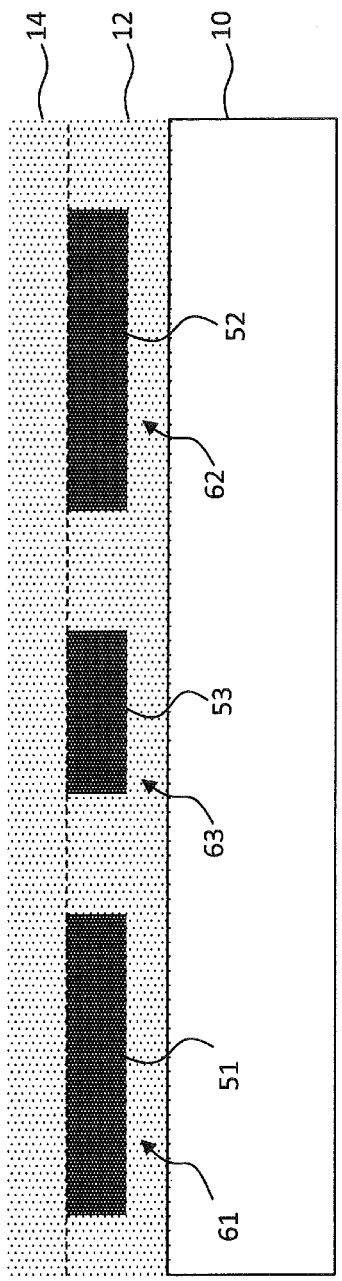
Figure 8G:
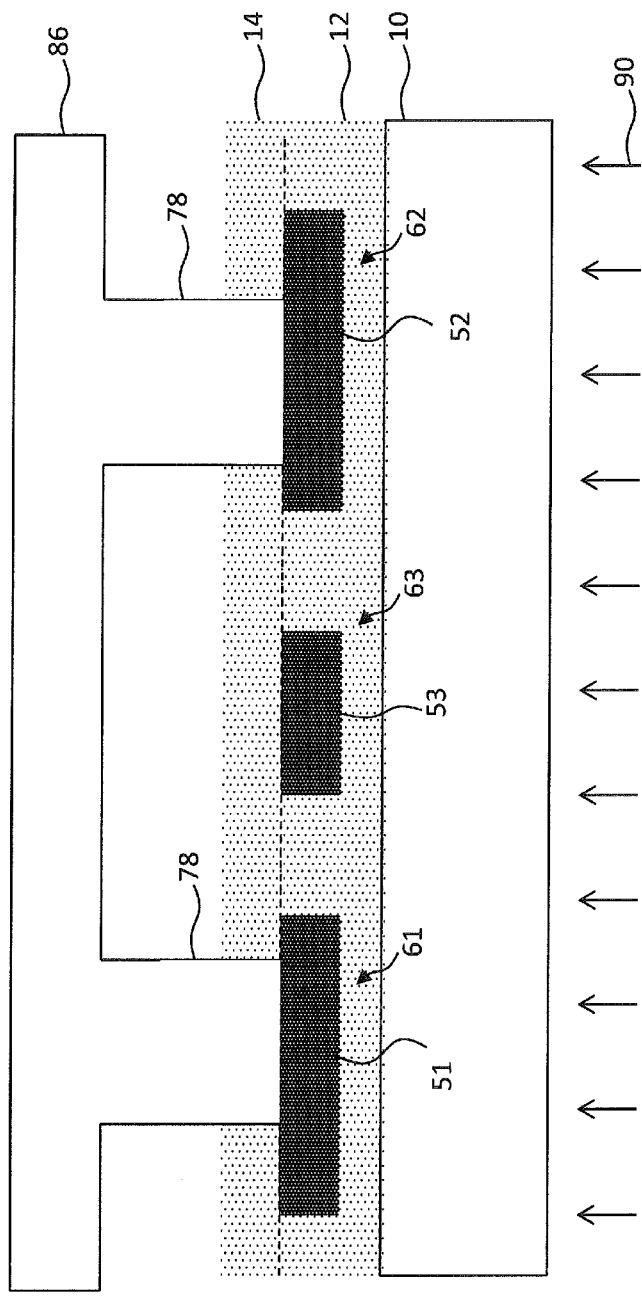
Figure 8H:
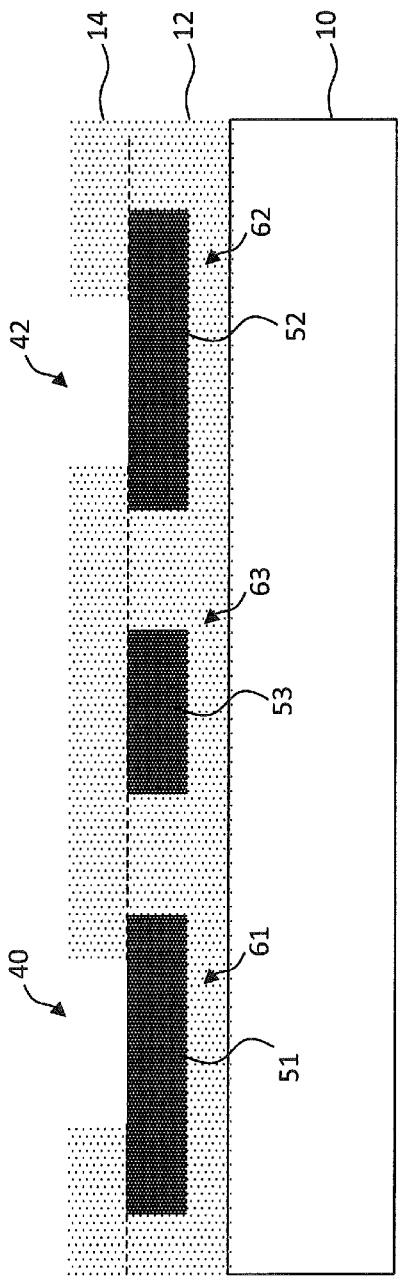

Referring to FIG. 8F, a curable second layer 14 is provided in step 210 adjacent to and in contact with the cured first layer 12, the first, second, and third micro-wires 51, 52, 53 over the substrate 10. Referring to FIG. 8G, the curable second layer 14 is imprinted in step 215 with a second stamp 86 having protrusions 78 located over at least a portion of the first and second micro-channels 61, 62 and separate from the third micro-channel 63. The curable second layer 14 is cured in step 220, for example with radiation 90, and the second stamp 86 is removed. Referring to FIG. 8H, an imprinted first connecting micro-channel 40 is formed in the cured second layer 14 over at least a portion of the first micro-channel 61 and the first micro-wire 51 and an imprinted second connecting micro-channel 42 is formed in the cured second layer 14 over at least a portion of the second micro-channel 62 and second micro-wire 52. The first connecting micro-channel 40 and the second connecting micro-channel 42 are separate from the third micro-channel 63 and third micro-wire 53 formed in the cured first layer 12 over the substrate 10.

Figure 8I:
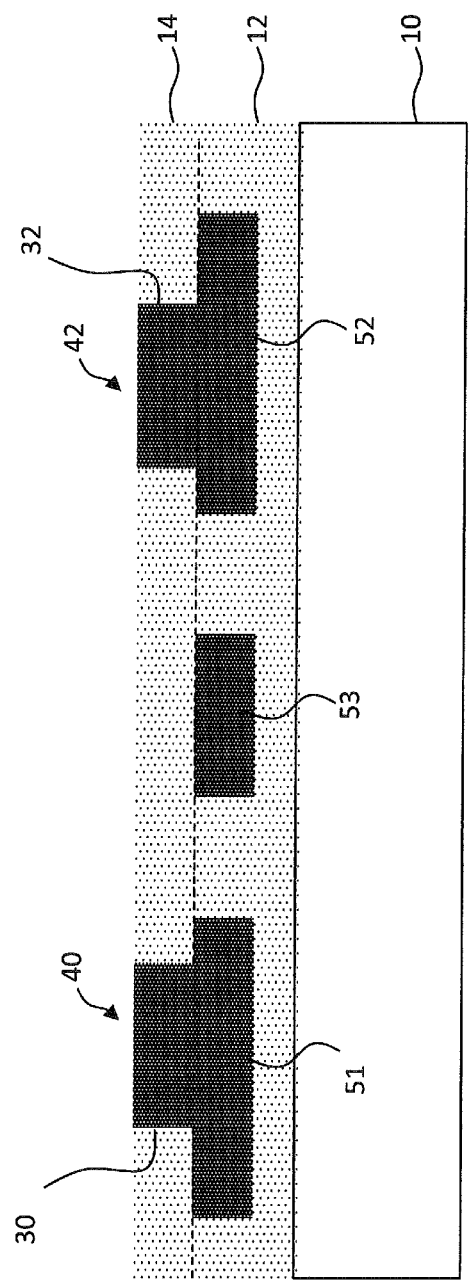

A conductive ink is provided in the first and second connecting micro-channels 40, 42 in step 230, for example by coating the cured second layer 14 with conductive ink and wiping excess conductive ink from the surface of the cured second layer 14. The conductive ink is cured in step 235 to form a first connecting micro-wire 30 in the first connecting micro-channel 40 and a second connecting micro-wire 32 in the second connecting micro-channel 42 in the cured second layer 14 over the cured first layer 12 over the substrate 10, as illustrated in FIG. 8I. First connecting micro-wire 30 is in electrical contact with first micro-wire 51 and second connecting micro-wire 32 is in electrical contact with second micro-wire 52. The first and second connecting micro-wires 30, 32 are separate from the third micro-wire 53.

Figure 8J:
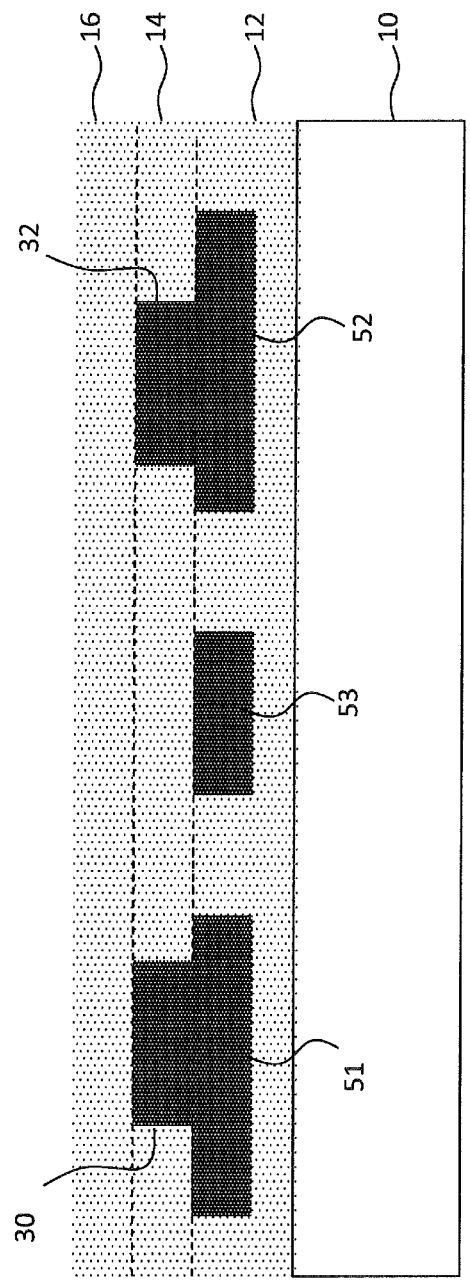
Figure 8K:
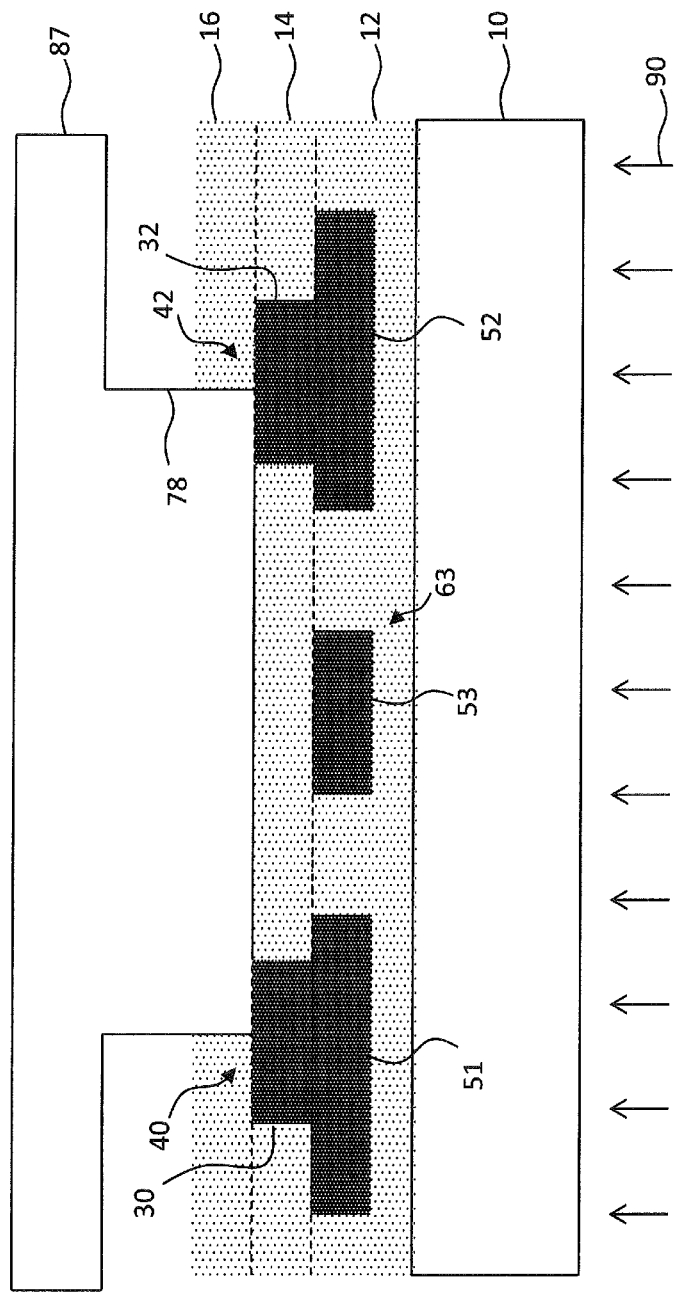
Figure 8L:
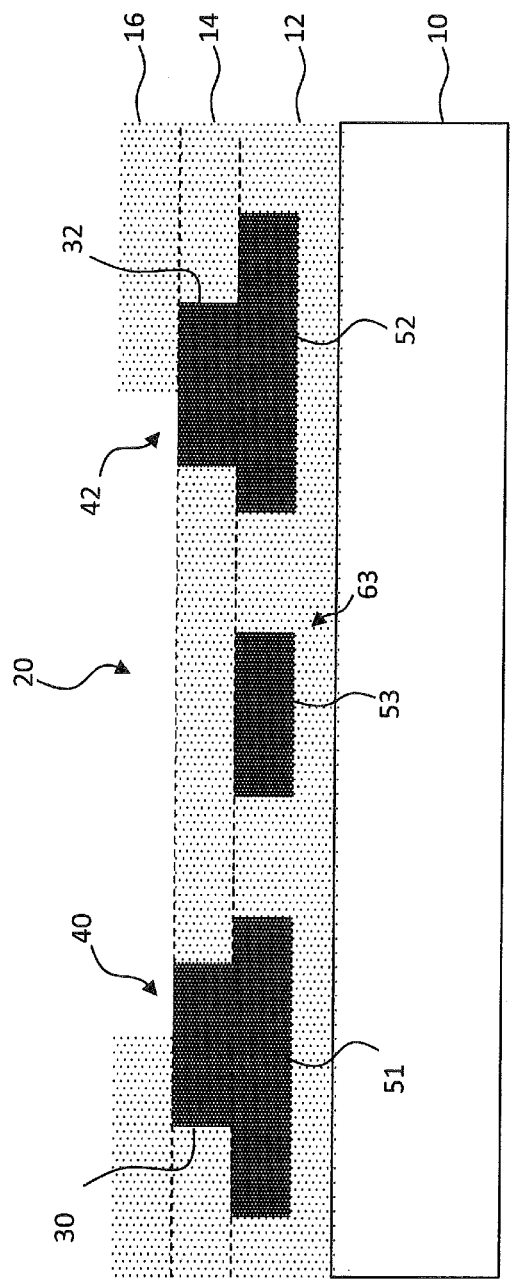

Referring next to FIG. 8J, a curable third layer 16 is provided in step 310 adjacent to and in contact with the cured second layer 14 and the first and second connecting micro-wires 30, 32. The curable third layer 16 is on a side of the cured second layer 14 opposite the cured first layer 12, the first, second, and third micro-wires 51, 52, 53, and the substrate 10. Referring to FIG. 8K, the curable third layer 16 is imprinted in step 315 with a third stamp 87 having a protrusion 78 located over at least a portion of the first and second connecting micro-channels 40, 42 and first and second connecting micro-wires 30, 32 and separate from the third micro-channel 63 and third micro-wire 53. The protrusions 78 can, but need not extend over the first and second micro-wires 51, 52. The curable third layer 16 is cured in step 320, for example with radiation 90, and the third stamp 87 removed. Referring to FIG. 8L, an imprinted bridge micro-channel 20 is formed in cured third layer 16 over the cured second layer 14 and the substrate 10, over at least a portion of the first connecting micro-channel 40, over at least a portion of the first connecting micro-wire 30, over at least a portion of the second connecting micro-channel 42, and over at least a portion of the second connecting micro-channel 42. The bridge micro-channel 20 is separate from the third micro-channel 63 and the third micro-wire 53 formed in the cured layer 12 over the substrate 10. The bridge micro-channel 20 can, but need not extend over the first and second micro-wires 51, 52.

Figure 8M:
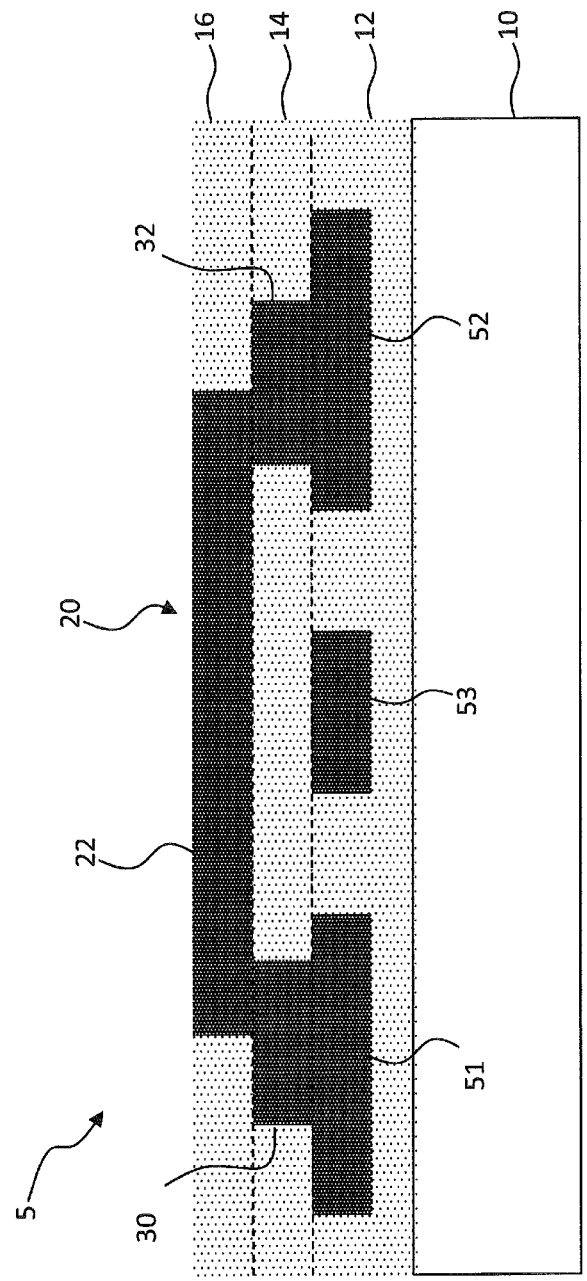

A conductive ink is provided in the bridge micro-channel 20 in step 330, for example by coating the cured third layer 16 with conductive ink and wiping excess conductive ink from the surface of the cured third layer 16. The conductive ink is cured in step 335 to form a bridge micro-wire 22 in the bridge micro-channel 20 in the cured third layer 16 over the cured second layer 14 and opposite the cured layer 12 and the substrate 10, as illustrated in FIG. 8M. Bridge micro-wire 22 is in electrical contact with first and second connecting micro-wires 30 and 32 and first and second micro-wires 51, 52. Bridge micro-wire 22 is electrically isolated from (not in electrical contact with) third micro-wire 53.

Thus, first and second micro-wires 51 and 52, formed in a common layer (cured first layer 12) in an imprinted micro-wire structure 5, are in electrical contact without having electrical contact with third micro-wire 53 formed in the common layer, enabling complex electrical interconnection circuitry over the substrate 10 using simple and inexpensive imprinting processes.

In a further embodiment of the present invention, the step 215 of forming the imprinted first or second connecting micro-channels 40, 42 further includes contacting the first micro-wire 51 or second micro-wire 52 with the imprinting second stamp 86. By contacting the first micro-wire 51 or second micro-wire 52 with the second stamp 86, material of the second layer 14 is removed from the contacted area of the first or second connecting micro-wires 30, 32 so that the first or second connecting micro-wires 30, 32 can electrically connect with the first or second micro-wire 51, 52, respectively. Similarly, the step 315 of forming the imprinted bridge micro-channels 20 further includes contacting the first or second connecting micro-wire 30, 32 with the imprinting third stamp 87. By contacting the first or second connecting micro-wire 30, 32 with the imprinting third stamp 87, material of the second layer 14 is removed from the contacted area of the first or second connecting micro-wires 30, 32 so that the first or second connecting micro-wires 30, 32 can electrically connect with the bridge micro-wire 22.

Figure 12A:
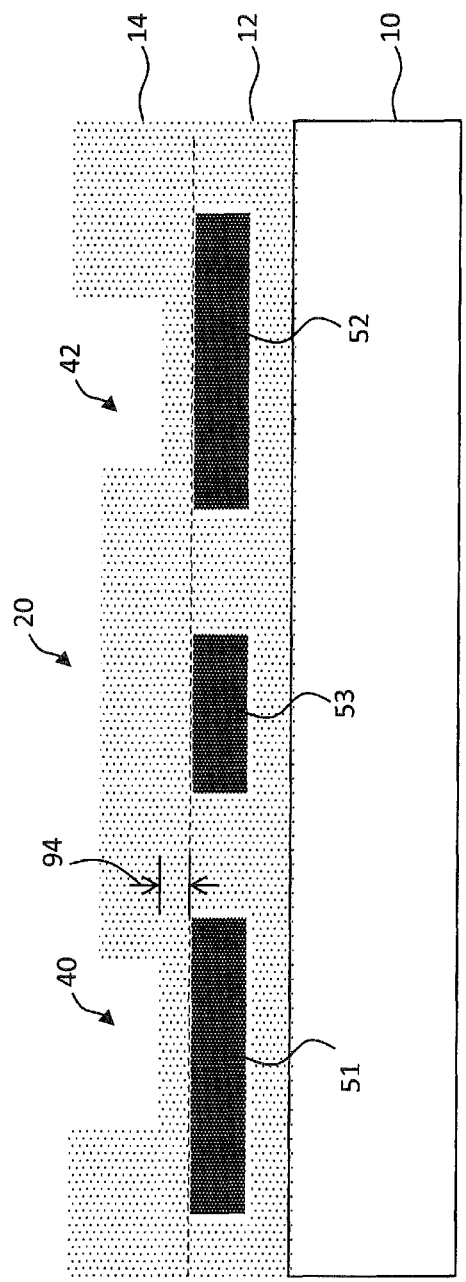
FIGS. 12A-12B are cross sections illustrating sequential optional steps useful for various methods of the present invention.
Figure 12B:
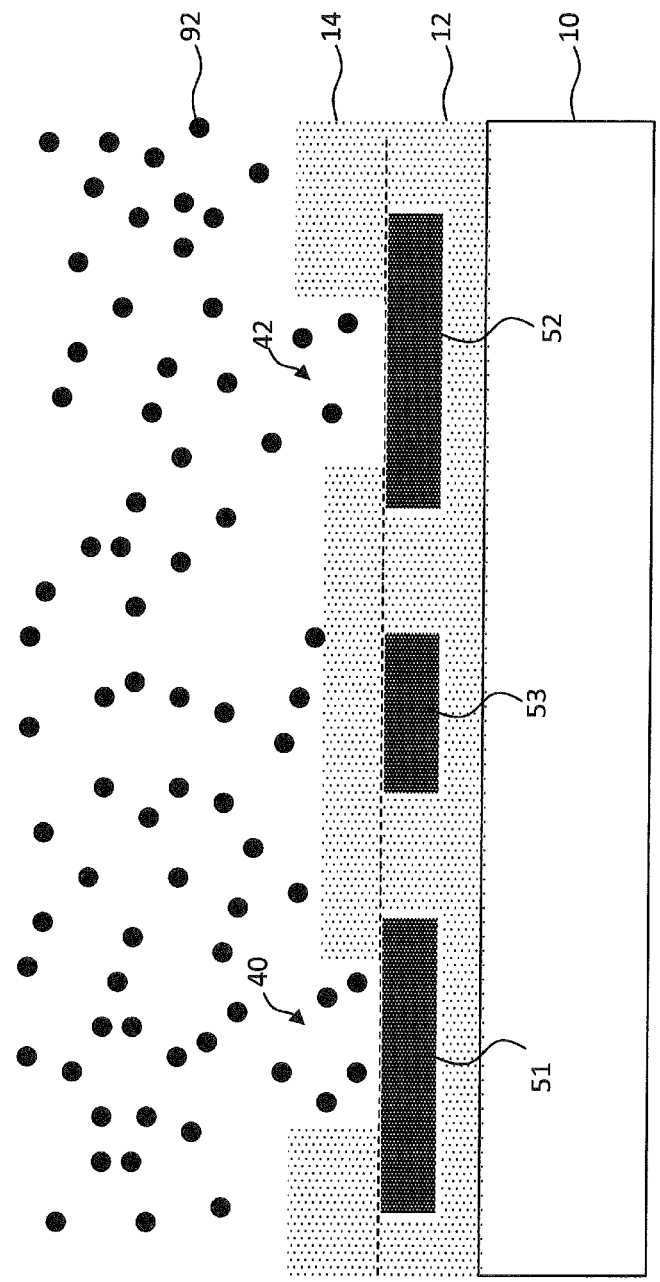

In an alternative or additional embodiment illustrated in FIGS. 12A and 12B, residual material in the first or second connecting micro-channels 40, 42 in the second layer 14 is removed to clear the surface of the first or second micro-wires 51, 52 in the first layer 12. Referring to FIG. 12A, the first layer 12 includes the first, second, and third micro-wires 51, 52, 53 formed over the substrate 10. The second layer 14 has imprinted first and second connecting micro-channels 40, 42 formed on the first layer 12 and the first, second, and third micro-wires 51, 52, 53. However, as shown in FIG. 12A, it is possible that material over the first micro-wire 51 and the second micro-wire 52 remains in the first and second connecting micro-channels 40, 42, respectively. For example, it can be difficult to exactly locate the imprinting stamps precisely in contact with an underlying layer, or it can be preferred not to, since such contact can cause deformation of the stamp or the layer that the stamp is imprinting. If this residual material stays in place, it can prevent electrical contact between first and second micro-wires 51, 52 and subsequently formed first and second connecting micro-wires 30, 32. Therefore, referring to FIG. 12B, an additional and optional etch step 225 is performed using plasma 92 to etch the residual material. The plasma 92 contains oxygen as an etchant gas to remove the organic material. As shown in FIG. 12B, plasma 92 removes a portion of the second layer 14 to clear the first and second connecting micro-channels 40, 42 so that portions of the first micro-wire 51 and the second micro-wire 52 in the first layer 12 over the substrate 10 are exposed.

The plasma 92 removes a thinning depth 94 (FIG. 12A) of the entire second layer 14 and it is therefore important to remove only enough of the second layer 14 to clear the first and second connecting micro-channels 40, 42 without exposing the third micro-wire 53 to avoid an electrical short between the third micro-wire 53 and any micro-wires formed over the third micro-wire 53 (such as the bridge micro-wire 22 illustrated in FIG. 1). Thus, to prevent unwanted electrical shorts between micro-wires in adjacent layers, the thinning depth 94 is less than the difference between the depth of the cured second or third layers 14, 16 and the depth of any micro-channels in the corresponding cured second or third layer 14, 16.

The use of plasma 92 to remove a portion of a layer to clear a micro-channel can be used after any imprinting step that forms a micro-channel over an underlying micro-wire. Thus, step 225 is performed after the imprinting step 220 to clear the first and second connecting micro-channels 40, 42 and step 325 is performed after step 320 to clear the bridge micro-channel 20 (FIG. 13).

The steps illustrated with respect to FIGS. 8A-8M form an imprinted micro-wire structure 5 corresponding to the imprinted micro-wire structure illustrated in FIGS. 1 and 2. In such a structure, the first layer 12 is formed on the substrate 10, the second layer 14 is formed on the first layer 12 and the first, second, and third micro-wires 51, 52, 53, and the third layer 16 is formed on the second layer 14 and the first and second connecting micro-wires 30, 32.

In the alternative embodiment illustrated in FIGS. 3 and 4, the third layer 16 is formed on the substrate 10, the second layer 14 is formed on the third layer 16 and the bridge micro-wire 22, and the first layer 12 is formed on the second layer 14 and first and second connecting micro-wires 30, 32. Thus, the locations of the first, second and third layers 12, 14, 16 of the embodiment of FIG. 1 are reversed in the embodiment of FIG. 3 with respect to the substrate 10.

In a further embodiment of the present invention, a method similar to that illustrated in FIGS. 8A-8M is used to form the micro-wire structure of FIG. 3. In FIGS. 8A-8M, the first layer 12 is formed first on the substrate 10, the second layer 14 is formed second on the first layer 12, and the third layer 16 is formed third on the second layer 14. In contrast, in FIGS. 9A-9M the third layer 16 is formed first on the substrate 10, the second layer 14 is formed second on the third layer 16, and the first layer 12 is formed third on the second layer 14. The labels first, second, and third, do not necessarily imply order with respect to the substrate 10 or temporal order of construction.

Figure 9A:
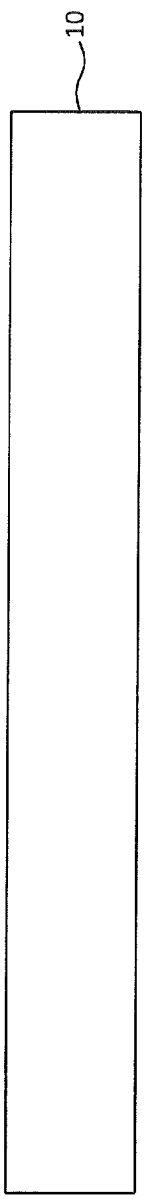
Figure 9B:
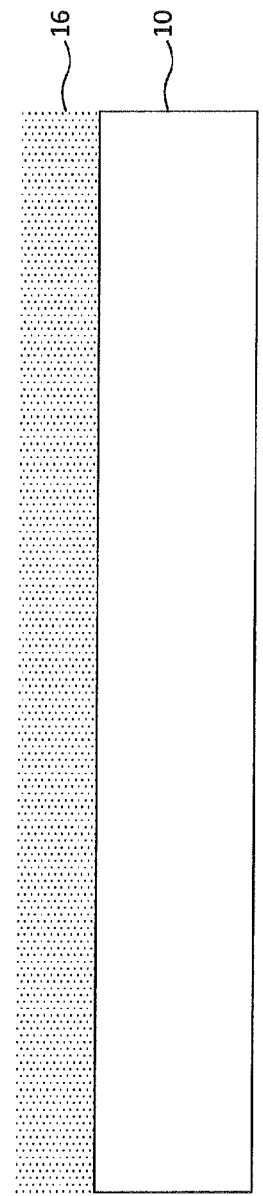
Figure 9D:
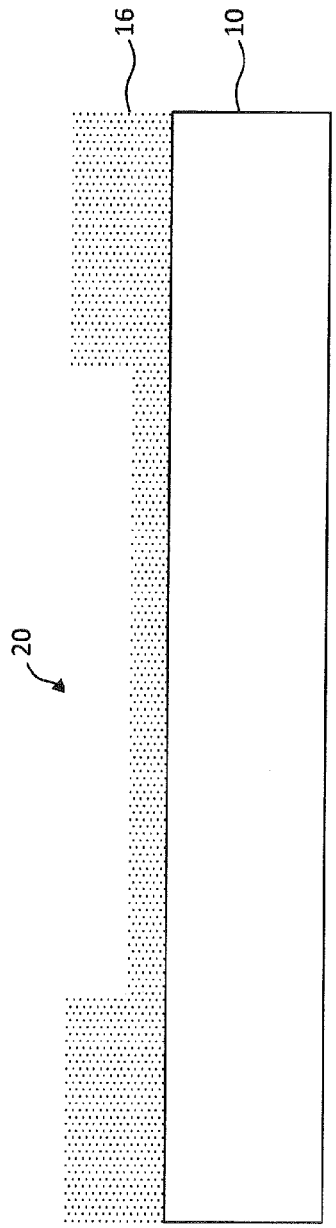
Figure 14:
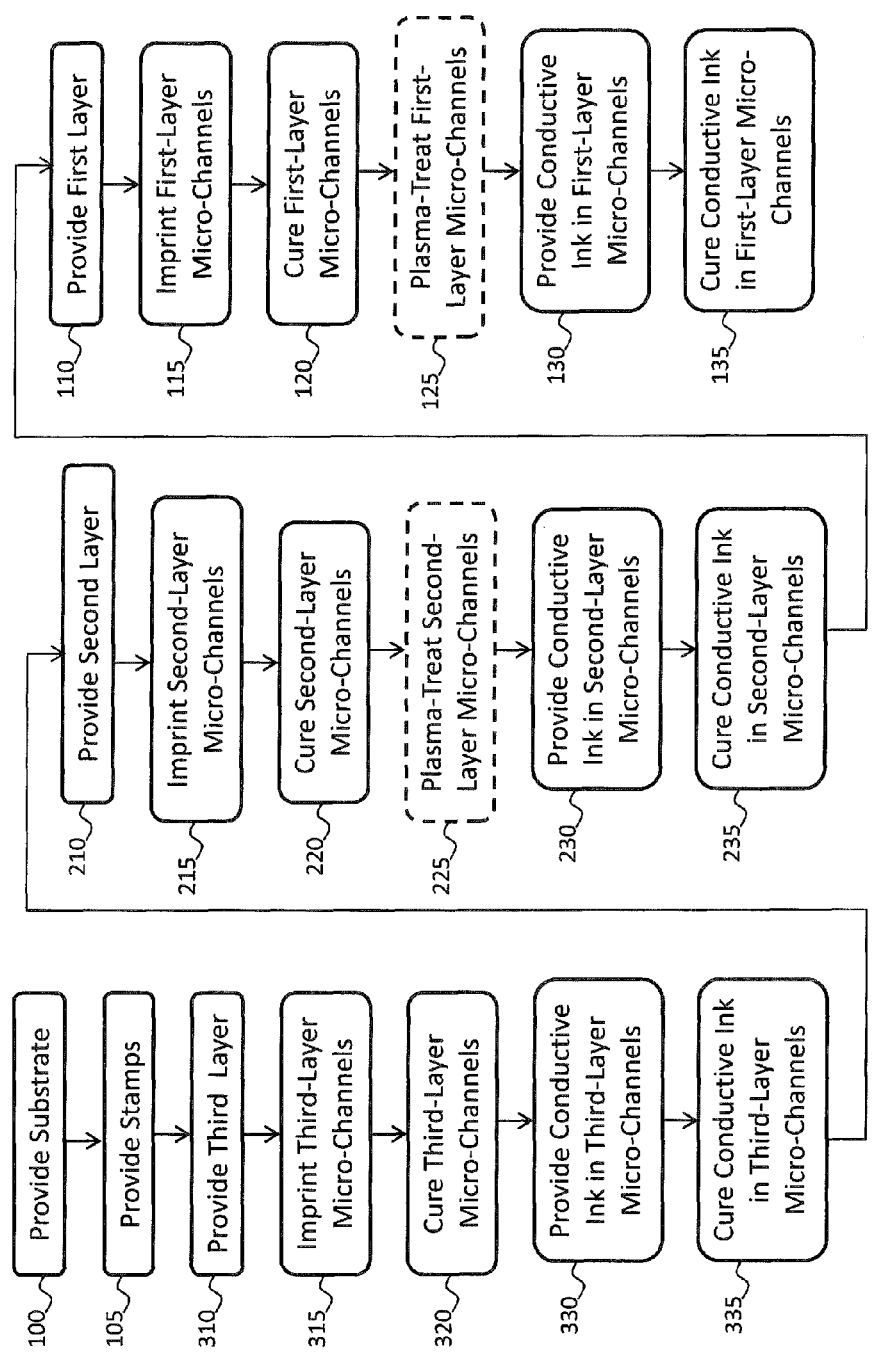
FIG. 14 is a flow diagram illustrating an embodiment of the present invention corresponding to the cross sections of FIGS. 9A-9M.

Referring to FIGS. 9A-9M and to FIG. 14, in a method of the present invention, a substrate 10 as illustrated in FIG. 9A is provided in step 100. First, second, and third stamps 88, 86, 87 are provided in step 105. In step 310 and as illustrated in FIG. 9B a curable third layer 16 is provided in relation to the substrate 10, for example by coating a layer of curable material on the substrate 10 or on layers formed on the substrate 10.

Referring next to FIG. 9C, bridge micro-channel 20 is formed in the curable third layer 16 by at least imprinting the curable third layer 16 with the third stamp 87 located so that protrusion 78 extends into the curable third layer 16 over the substrate 10 in step 315. The curable third layer 16 is cured, for example with radiation 90, in step 320 and the third stamp 87 is removed from the cured third layer 16 (FIG. 9D) so that the bridge micro-channel 20 is formed in the cured third layer 16 over the substrate 10.

Figure 9E:
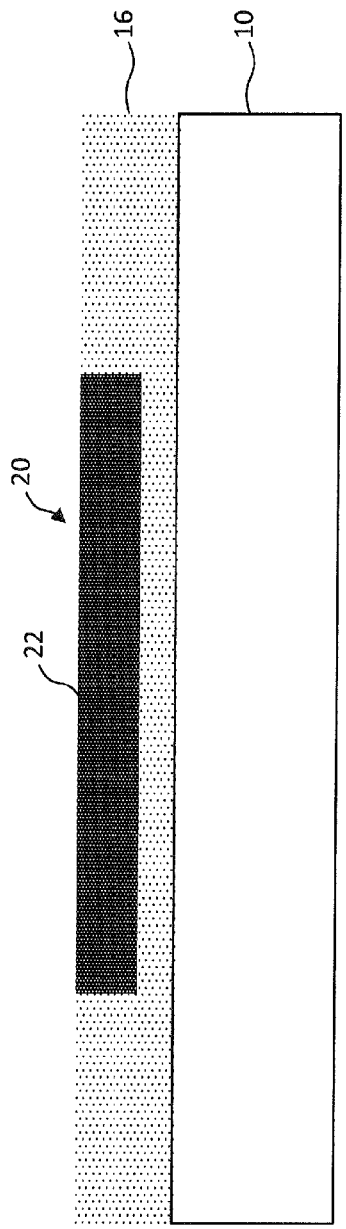

A conductive ink is provided in the bridge micro-channel 20 in step 330, for example by coating the cured third layer 16 with conductive ink and wiping excess conductive ink from the surface of the cured third layer 16. The conductive ink is cured in step 335 to form a bridge micro-wire 22 in the bridge micro-channel 20 in cured third layer 16 over substrate 10, as illustrated in FIG. 9E.

Figure 9F:
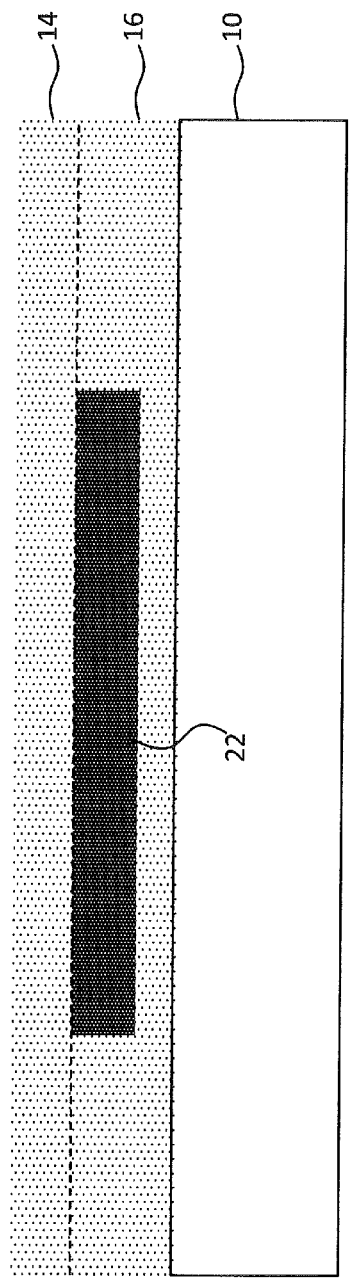
Figure 9H:
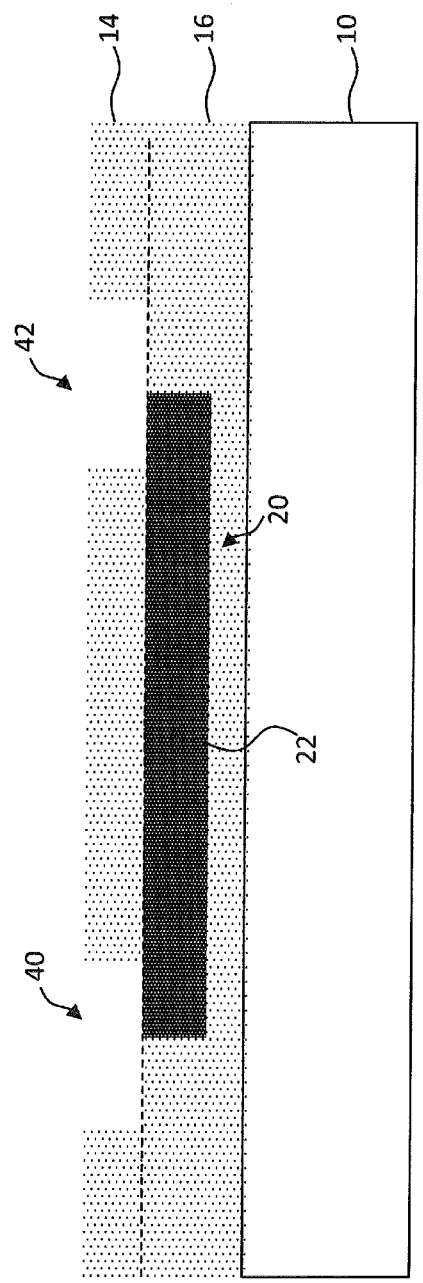

Referring to FIG. 9F, a curable second layer 14 is provided in step 210 adjacent to and in contact with the cured third layer 16 and the bridge micro-wire 22 over the substrate 10. Referring to FIG. 9G, the curable second layer 14 over the third layer 16 and the substrate 10 is imprinted in step 215 with the second stamp 86 having protrusions 78 located over at least a portion of the bridge micro-channel 20 and bridge micro-wire 22. The curable second layer 14 is cured in step 220, for example with radiation 90, and the second stamp 86 removed. Referring to FIG. 9H, an imprinted first connecting micro-channel 40 is formed in the cured second layer 14 over at least a portion of the bridge micro-channel 20 and the bridge micro-wire 22 and an imprinted second connecting micro-channel 42 is formed in the cured second layer 14 over at least a portion of the bridge micro-channel 20 and bridge micro-wire 22 in the third layer 16 over the substrate 10.

Figure 9I:
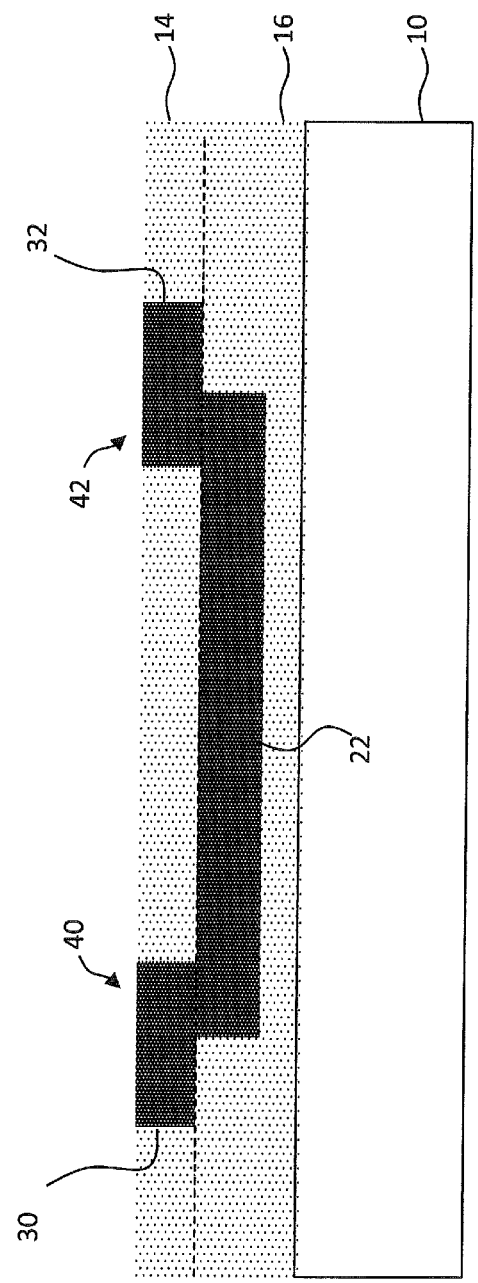

A conductive ink is provided in the first and second connecting micro-channels 40, 42 in step 230, for example by coating the cured second layer 14 with conductive ink and wiping excess conductive ink from the surface of the cured second layer 14. The conductive ink is cured in step 235 to form a first connecting micro-wire 30 in the first connecting micro-channel 40 and a second connecting micro-wire 32 in the second connecting micro-channel 42 in the cured second layer 14 over the cured third layer 16 and bridge micro-wire 22 and over the substrate 10, as illustrated in FIG. 9I. First connecting micro-wire 30 and second connecting micro-wire 32 are both in electrical contact with bridge micro-wire 22.

Figure 9J:
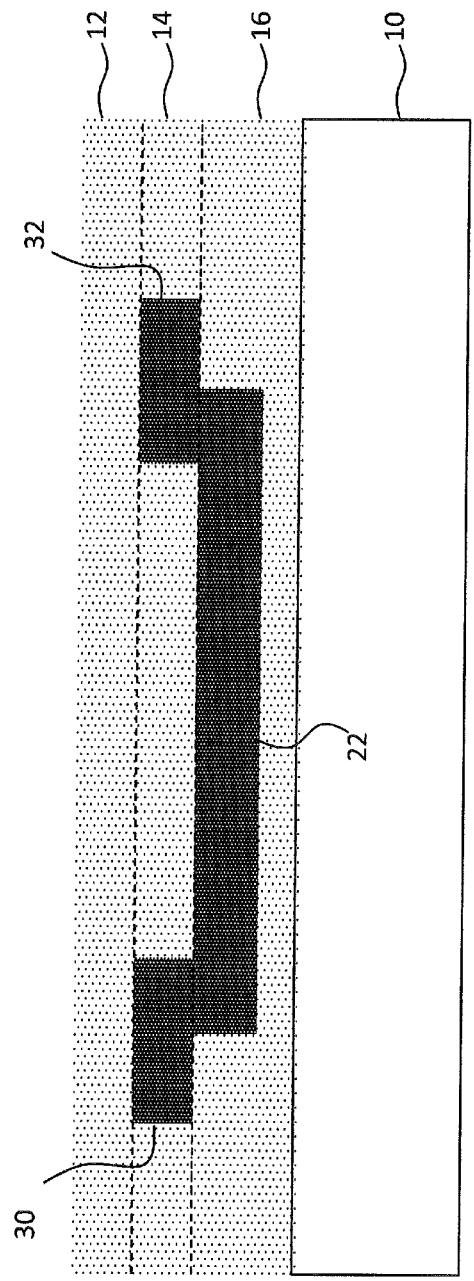
Figure 9K:
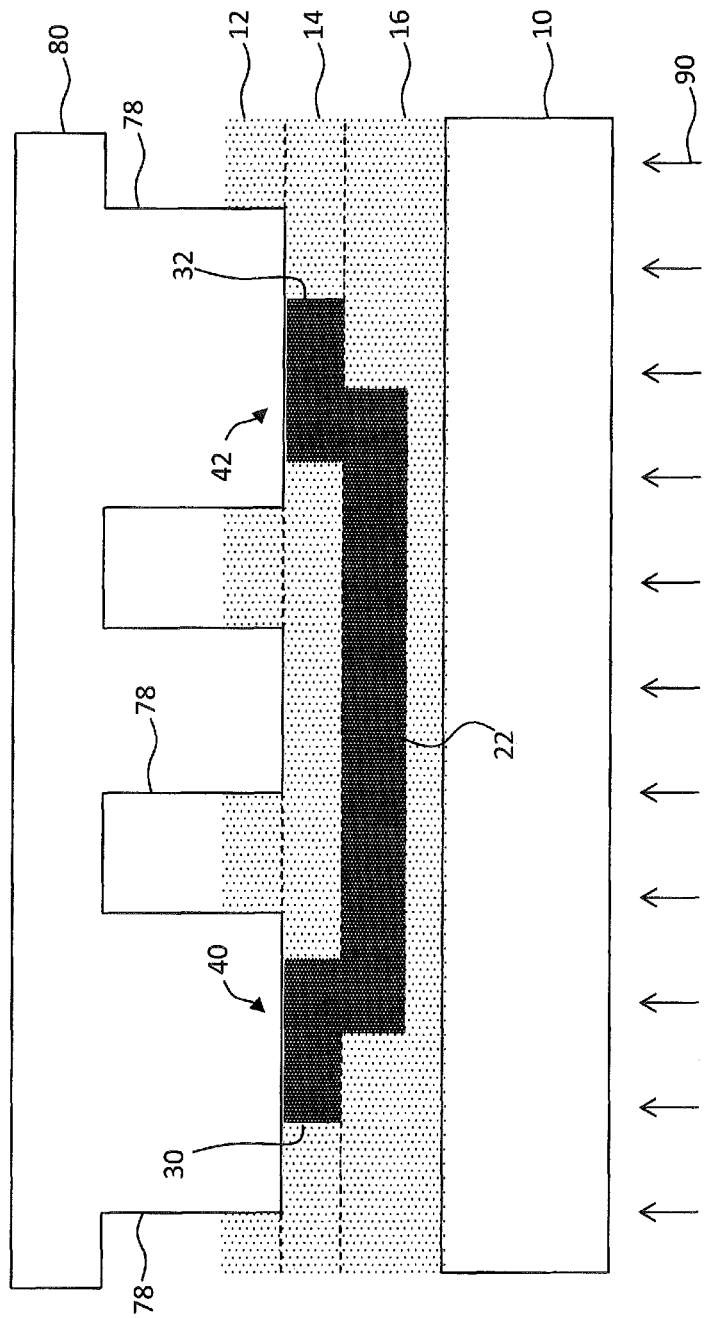
Figure 9L:
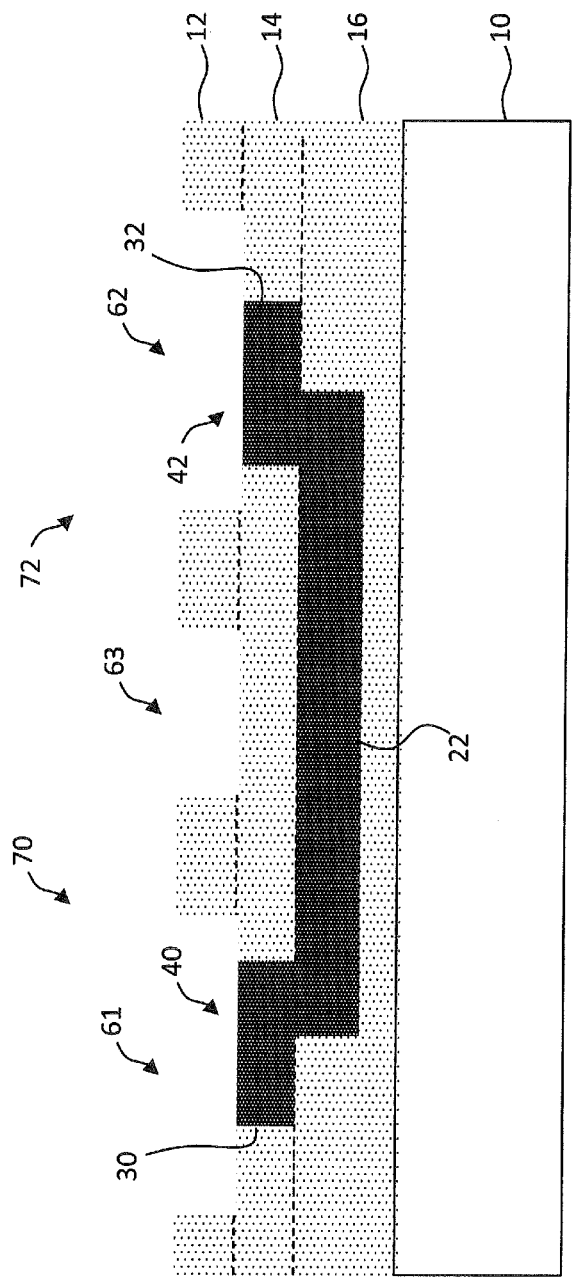

Referring next to FIG. 9J, a curable first layer 12 is provided in step 110 adjacent to and in contact with the cured second layer 14 and the first and second connecting micro-wires 30, 32. The curable first layer 12 is on a side of the cured second layer 14 opposite the cured third layer 16, the bridge micro-wire 22, and the substrate 10. Referring to FIG. 9K, the curable first layer 12 is imprinted in step 115 with a first stamp 80 having protrusions 78 located over at least a portion of the first and second connecting micro-channels 40, 42 and first and second connecting micro-wires 30, 32. The curable first layer 12 is cured in step 120, for example with radiation 90, and the first stamp 80 removed. Referring to FIG. 9L, imprinted first, second, and third micro-channels 61, 62, 63 are formed in cured first layer 12 over the cured second layer 14, the cured third layer 16, and the substrate 10, over at least a portion of the first connecting micro-channel 40 and at least a portion of the first connecting micro-wire 30, and over at least a portion of the second connecting micro-channel 42 and at least a portion of the second connecting micro-channel 42.

The third micro-channel 63 divides the first layer 12 into first and second portions 70, 72. The first micro-channel 61 is located in the first portion 70 and the second micro-channel 62 is located in the second portion 72. The third micro-channel 63 is separate from the first micro-channel 61, the second micro-channel 62, the first and second connecting micro-channels 40, 42, the first and second connecting micro-wires 30, 32, and the bridge micro-wire 22.

Figure 9M:
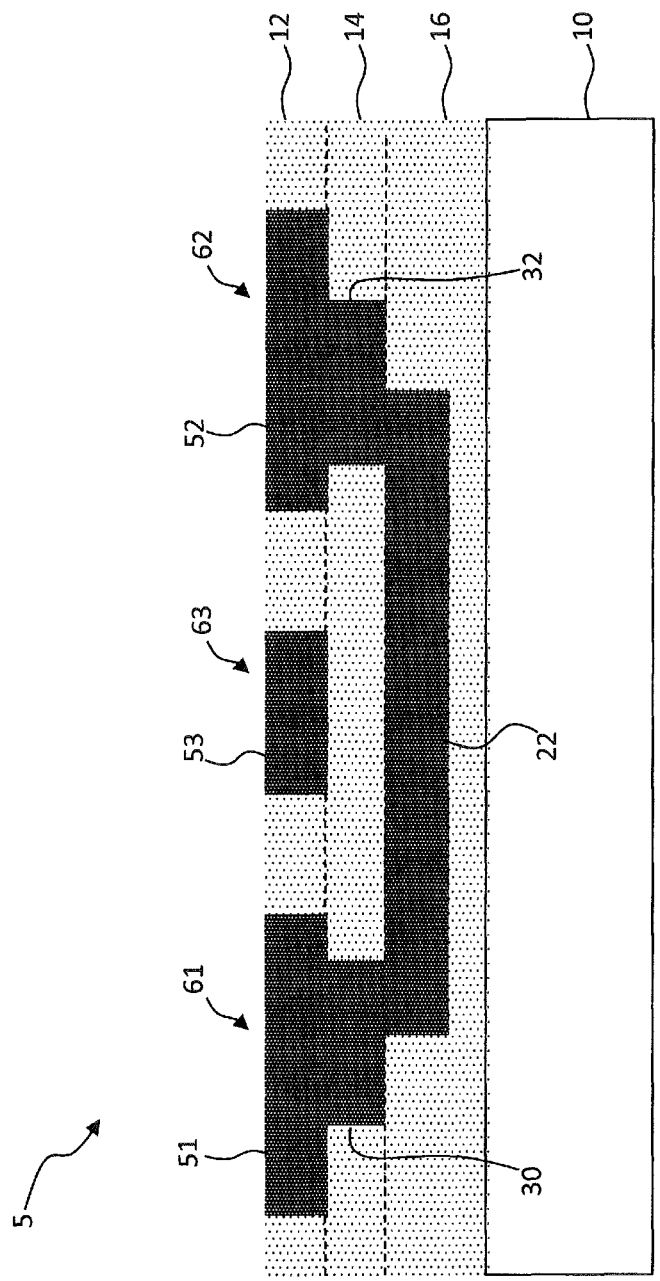

A conductive ink is provided in the first, second, and third micro-channels 61, 62, 63 in step 130, for example by coating the cured first layer 12 with conductive ink and wiping excess conductive ink from the surface of the cured first layer 12. The conductive ink is cured in step 135 to form first, second, and third micro-wires 51, 52, 53 in the first, second, and third micro-channels 61, 62, 63 in the cured first layer 12 over the cured second layer 14 and opposite the cured layer 16, bridge micro-wire 22, and the substrate 10, as illustrated in FIG. 9M. Bridge micro-wire 22 is in electrical contact with first and second connecting micro-wires 30 and 32 and first and second micro-wires 51, 52. Bridge micro-wire 22 is electrically isolated from (not in electrical contact with) third micro-wire 53.

Thus, first and second micro-wires 51 and 52, formed in a common layer (cured layer 12), are in electrical contact without having electrical contact with third micro-wire 53 formed in the same layer, enabling complex electrical interconnection circuitry over the substrate 10 using simple and inexpensive imprinting processes.

In a further embodiment of the present invention, the step 215 of forming the imprinted second connecting micro-channels 40, 42 further includes contacting the bridge micro-wire 22 with the imprinting second stamp 86. By contacting the bridge micro-wire 22 with the second stamp 86, material of the second layer 14 is removed from the contacted area so that the first or second connecting micro-wires 30, 32 (FIG. 13) can electrically connect with the bridge micro-wire 22. Similarly, the step 115 of forming the imprinted first, second, or third micro-channels 61, 62, 63 further includes contacting the first or second connecting micro-wire 30, 32 with the imprinting first stamp 80. By contacting the first or second connecting micro-wire 30, 32 with the imprinting first stamp 80, material of the second layer 14 is removed from the contacted area so that the first or second connecting micro-wires 30, 32 can electrically connect with the first or second micro-wires 51, 52.

In an alternative or additional embodiment (not shown), residual material in the first or second connecting micro-channels 40, 42 is removed to clear the surface of the bridge micro-wire 22. It is possible that material over the bridge micro-wire 22 remains in the first and second connecting micro-channels 40, 42, respectively, after imprinting in step 215. For example, it is difficult to exactly locate the imprinting stamps precisely in contact with an underlying layer, or it is preferred not to, since such contact can cause deformation of the stamp or the layer that the stamp is imprinting. If this residual material stays in place, it can prevent electrical contact between subsequently formed first and second connecting micro-wires 30, 32 and bridge micro-wires 22. Therefore, an additional and optional step 225 is performed using plasma 92 to remove the remaining material. Plasma 92 etches a portion of the second layer 14 to clear the first and second connecting micro-channels 40, 42 so that portions of the bridge micro-wire 22 in third layer 16 over the substrate 10 are exposed, as discussed with respect to FIGS. 12A and 12B.

In an embodiment, the plasma 92 removes a thinning depth 94 (FIG. 12A) of the entire second layer 14 and it is therefore important to remove only enough of the second layer 14 to clear the first and second connecting micro-channels 40, 42 without exposing other portions of the bridge micro-wire 22 to avoid an electrical short between the bridge micro-wire 22 and any micro-wires other than the first and second connecting micro-wires 30, 32 formed over the bridge micro-wire 22. Thus, to prevent unwanted electrical shorts between micro-wires in adjacent layers, the thinning depth 94 is less than the difference between the depth of the cured first or second layer 12, 14 and the depth of any micro-channels in the corresponding cured first or second layer 12, 14.

The use of plasma 92 to remove a portion of a layer to clear a micro-channel can be used after any imprinting step that forms a micro-channel over an underlying micro-wire. Thus, step 225 is performed after the imprinting step 220 to clear the first and second connecting micro-channels 40, 42 and step 125 is performed after step 120 to clear the first and second micro-channels 61 and 62 (FIG. 14).

In other embodiments of the present invention, the material used in any of the first, second, or third layers 12, 14, 16 are the same. The first, second, or third layers 12, 14, 16 can include cross-linking material and the material in each layer are cross linked by curing the material, for example through heat or radiation, or both.

Thus, in an embodiment, the curable first layer 12 includes first curable material and the first stamp 80 is located in contact with the first curable material and the first curable material is at least partially cured to form the first, second, and third micro-channels 61, 62, 63. The curable second layer 14 includes second curable material and the second stamp 86 is located in contact with the second curable material and the second curable material is at least partially cured to form the first and second connecting micro-channels 40, 42. The curable third layer 16 includes third curable material and the third stamp 87 is located in contact with the third curable material and the third curable material is at least partially cured to form the bridge micro-channel 20.

Furthermore, according to embodiments of the present invention, the first layer 12 is cross linked to the second layer 14 by partially curing the first layer 12 in step 120 and further curing both the first layer 12 and the second layer 14 in step 220 (FIG. 13). It is also possible to cross link the second layer 14 to the third layer 16 by partially curing the second layer 14 in step 220 and further curing both the second layer 14 and the third layer 16 in step 320 (FIG. 13). In the method of FIG. 14, the third layer 16 is partially cured in step 320 and the second and third layers 14, 16 cross linked in step 220. Similarly, the second layer 14 is partially cured in step 220 and the second and first layers 14, 12 cross linked in step 120.

When two adjacent layers include similar or the same materials and the materials in the adjacent layers are cross linked to each other, the adjacent layers can be indistinguishable or inseparable. Thus, adjacent cross-linked layers can form a single layer and the present invention includes single layers that include multiple cross-linked layers within the single layer. The multiple layers can be coated with similar materials in separate operations and then form a single layer that is cured or cross-linked in a single step.

The micro-wires in each layer can be formed by coating the layer with a conductive ink, removing excess ink from the surface of the layer, leaving ink in the micro-channels in the layer, and then curing the conductive ink to form a micro-wire. In some cases, removing excess ink from the surface of the layer can also remove ink from the micro-channels. Therefore, in a further embodiment, conductive ink is deposited in the first micro-channel 61, second micro-channel 62, third micro-channel 62, first connecting micro-channel 40, second connecting micro-channel 42, or bridge micro-channel 20 a second time. Conductive ink located in a micro-channel a first time can be partially cured before locating conductive ink in the micro-channel a second time, and the conductive inks cured together in a second curing step to form a single micro-wire.

Therefore, a method of the present invention includes providing conductive ink in the first, second, and third micro-channels 61, 62, 63 and at least partially or only partially curing the conductive ink to form the first, second, and third micro-wires 51, 52, 53, further includes providing conductive ink in the first and second connecting micro-channels 40, 42 (for example depositing by coating) and at least partially or only partially curing the conductive ink to form the first and second connecting micro-wires 30, 32, or further includes providing conductive ink in the bridge micro-channel 20 and at least partially or only partially curing the conductive ink to form the bridge micro-wire 22.

According to another embodiment, conductive ink located in micro-channels that are in contact can be cured in a common step to form a single micro-wire that extends through multiple micro-channels. Thus, the bridge micro-wire 22, the first and second connecting micro-wires 30, 32, and the first and second micro-wires 51, 52 can be at least partially cured in a single step to form a single micro-wire. Furthermore, if the conductive ink includes electrically conductive particles, the electrically conductive particles in the bridge micro-wire 22 and the electrically conductive particles in the first and second connecting micro-wires 30, 32 can be sintered, welded, or agglomerated together in a single curing step. Likewise, electrically conductive particles in the first and second connecting micro-wires 30, 32 can be sintered, welded, or agglomerated to the electrically conductive particles in the first and second micro-wires 51, 52.

Thus, a method of the present invention can include providing first conductive ink in the first, second, and third micro-channels 61, 62, 63 and at least partially or only partially curing the first conductive ink to form the first, second, and third micro-wires 51, 52, 53, providing second conductive ink in the first and second connecting micro-channels 40, 42 and at least partially or only partially curing the second conductive ink to form the first and second connecting micro-wires 30, 32, and at least partially curing the first and second conductive inks at the same time. The first and second conductive inks can include electrically conductive particles and the electrically conductive particles in the first conductive ink are sintered, welded, or agglomerated to the electrically conductive particles in the second conductive ink.

Similarly, a method of the present invention includes providing first conductive ink in the first and second connecting micro-channels 40, 42 and at least partially or only partially curing the first conductive ink to form the first and second connecting micro-wires 30, 32, providing second conductive ink in the bridge micro-channel 20 and at least partially or only partially curing the second conductive ink to form the bridge micro-wire 22, and at least partially or only partially curing the first and second conductive inks at the same time. The first and second conductive inks can include electrically conductive particles and the electrically conductive particles in the first conductive ink are sintered, welded, or agglomerated to the electrically conductive particles in the second conductive ink.

Figure 7:
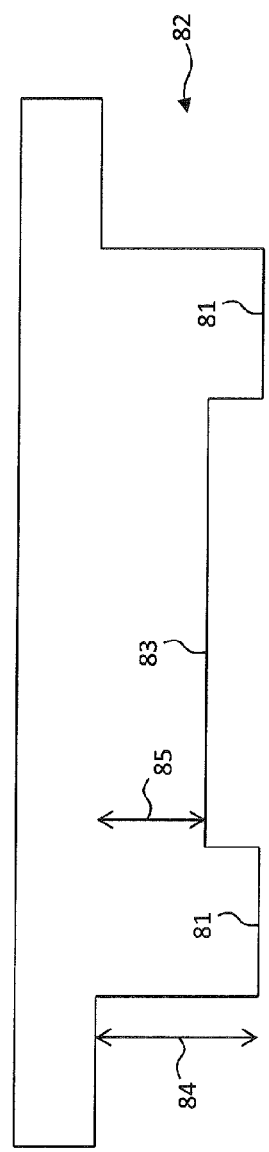
FIG. 7 is a cross section illustrating a multi-level imprinting stamp useful in a method of the present invention.

The embodiments of the present invention illustrated in FIGS. 8A-8M and in FIGS. 9A-9M use three stamps to imprint three layers of micro-channels in three steps as well as three separate steps to form the various micro-wires. According to another embodiment of the present invention, a multi-level second stamp 82 illustrated in FIG. 7 is used to form two layers of the imprinted micro-wire structure 5 in a single, common step at the same time. Referring to FIG. 7, a multi-level second stamp 82 has at least two deep protrusions 81 having a deep-protrusion depth 84 and at least one shallow protrusion 83 having a shallow-protrusion depth 85. The deep-protrusion depth 84 is greater than the shallow-protrusion depth 85 so that when the multi-level second stamp 82 is used to imprint a pattern in a layer, the portions of the pattern corresponding to the deep protrusions 81 are deeper than the portions of the pattern corresponding to the shallow protrusions 83.

Figure 15:
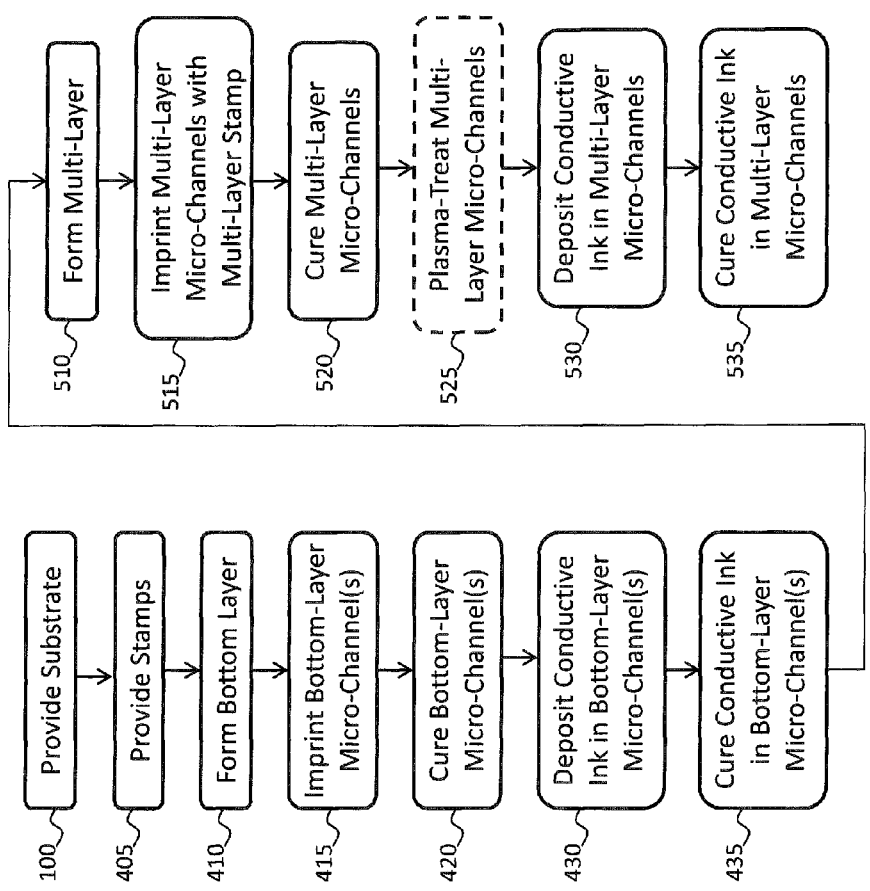
FIG. 15 is a flow diagram illustrating an embodiment of the present invention corresponding to the cross sections of FIGS. 10A-10I and FIGS. 11A-11I.

Thus, referring to FIGS. 10A-10I and to FIG. 15, another method of making an imprinted micro-wire structure 5 corresponding to FIG. 1 includes providing a substrate 10 (FIG. 10A) in step 100. A first stamp 80 and a different multi-level second stamp 82 are provided in step 405, the multi-level second stamp 82 having at least first and second deep protrusions 81 and one or more third shallow protrusions 83, the first and second deep protrusions 81 having a deep-protrusion depth 84 greater than a shallow-protrusion depth 85 of the shallow protrusion(s) 83, as illustrated in FIG. 7.

Figure 10A:
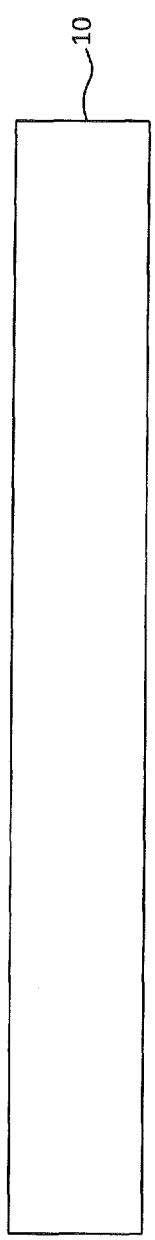
Figure 10B:
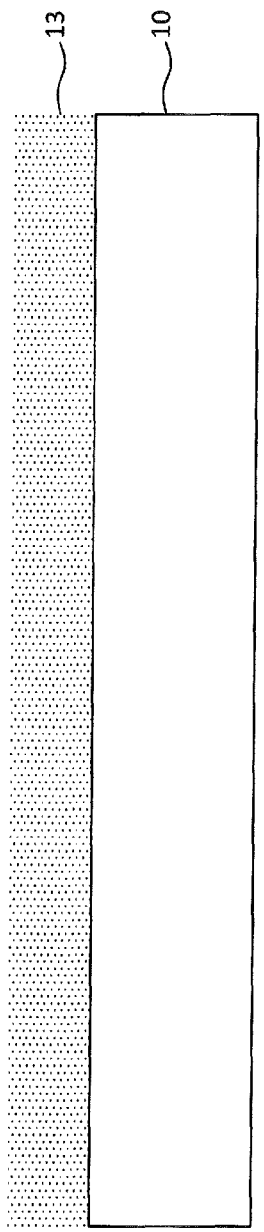
Figure 10C:
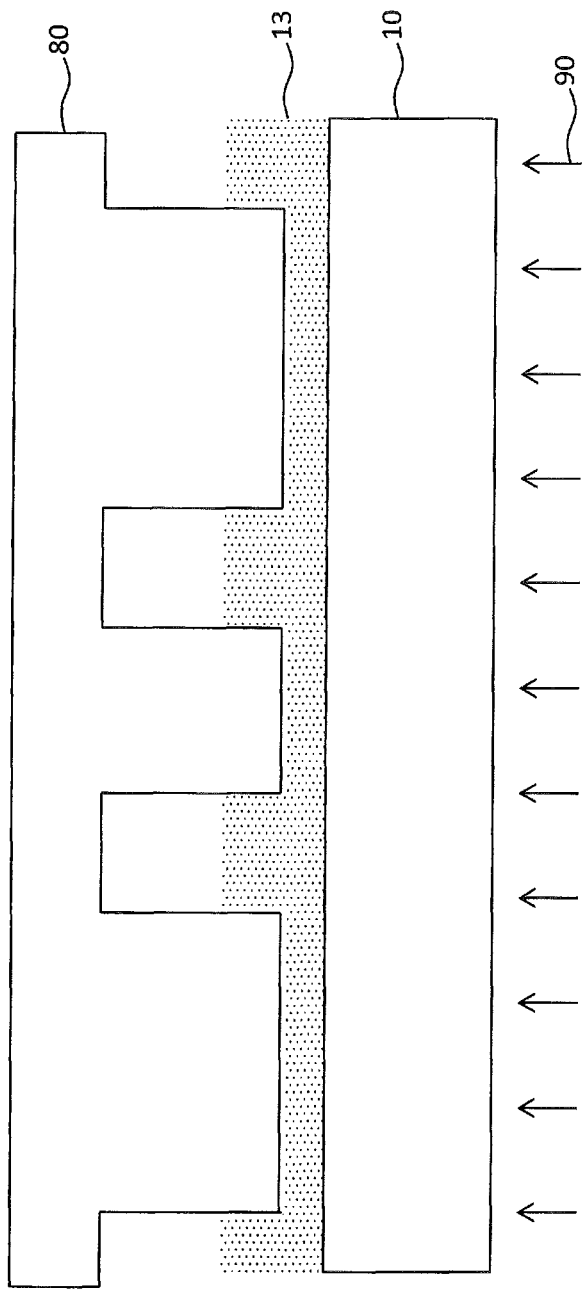
Figure 10F:
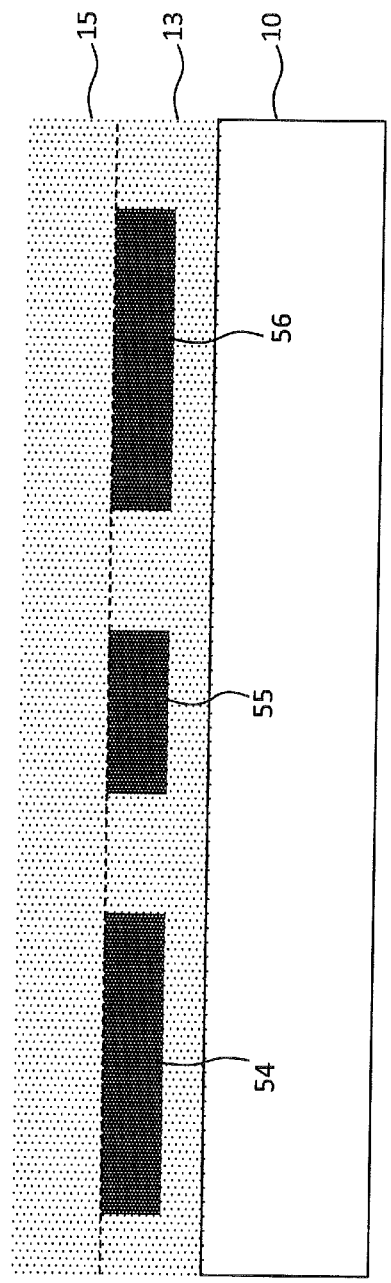

A curable bottom layer 13 is formed over the substrate 10 in step 410 (FIG. 10B). The bottom layer 13 corresponds to the first layer 12 in FIGS. 1, 2, and 10A-10I. The curable bottom layer 13 on the substrate 10 is imprinted with the first stamp 80 (step 415) and cured (step 420), for example with radiation 90, as illustrated in FIG. 10C to form first, second, and third bottom-layer micro-channels 64, 65, 66 in the curable bottom layer 13 on substrate 10 (FIG. 10D). In the embodiment of FIGS. 10A-10I, the first, second and third bottom-layer micro-channels 64, 65, 66 correspond to the first, second, and third micro-channels 61, 62, 63 of FIG. 1.

Conductive ink is deposited in the first, second, and third bottom-layer micro-channels 64, 65, 66 (step 430) and cured (step 435), forming first, second, and third bottom-layer micro-wires 54, 55, 56 in the respective first, second, and third bottom-layer micro-channels 64, 65, 66 in the bottom layer 13 (FIG. 10E) over the substrate 10. In this embodiment, the first, second, and third bottom-layer micro-wires 54, 55, 56 correspond to the first, second, and third micro-wires 51, 52, 53 of FIG. 1.

A curable multi-layer 15 is formed adjacent to and in contact with the cured bottom layer 13 and the first, second, and third bottom-layer micro-wires 54, 55, 56 over the substrate 10 in step 510 (FIG. 10F), for example by coating. In this embodiment, the multi-layer 15 is a combination of the second and third layers 14, 16 of FIG. 1, and the corresponding structures in second and third layers 14, 16 are made in common steps.

Figure 10H:
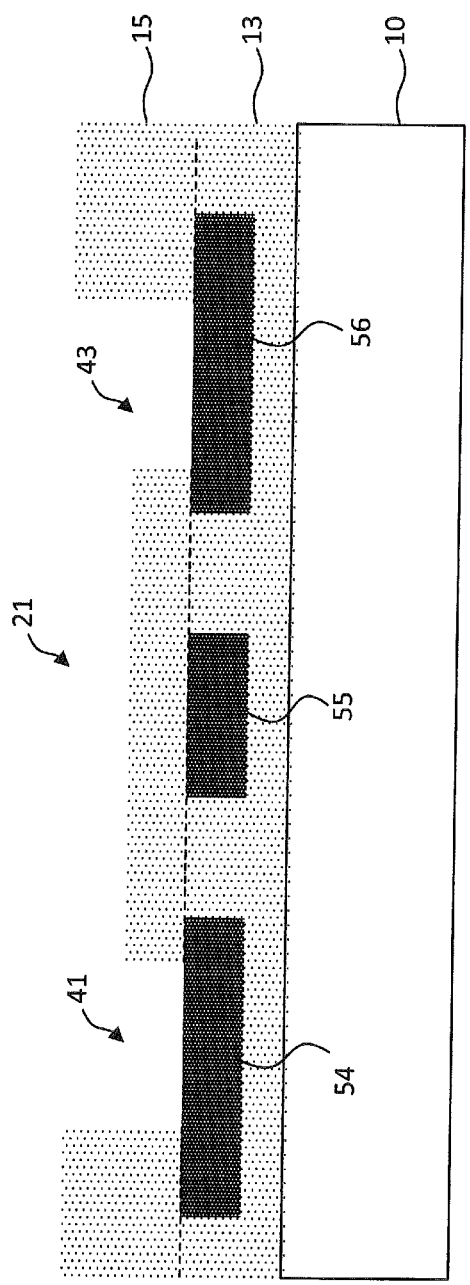
Figure 10I:
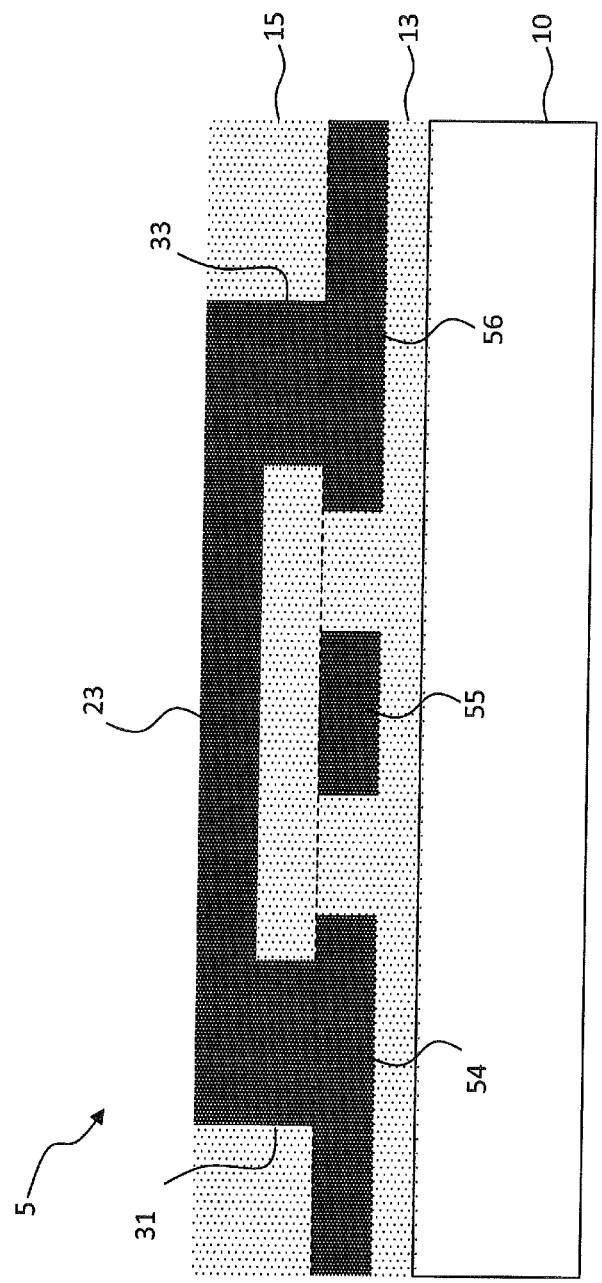

The curable multi-layer 15 is imprinted with the multi-level second stamp 82 in step 515 and cured in step 520 (FIG. 10G), for example with radiation 90. The imprinting is done over the first, second, and third bottom-layer micro-wires 54, 55, 56 in the bottom layer 13 and over the substrate 10. Referring also to FIG. 10H, at least first and second multi-layer micro-channels 41, 43 and a top-layer micro-channel 21 in the curable multi-layer 15 are formed in a common step by imprinting with the multi-level second stamp 82. In this embodiment, the first and second multi-layer micro-channels 41, 43 correspond to the first and second connecting micro-channels 40, 42 and the top-layer micro-channel 21 corresponds to the bridge micro-channel 20 of FIG. 1.

The first multi-layer micro-channel 41 formed by the first deep protrusion 81 of the multi-level second stamp 82 is located over at least a portion of the first bottom-layer micro-wire 54, the second multi-layer micro-channel 43 formed by the second deep protrusion 81 of the multi-level second stamp 82 is located over at least a portion of the second bottom-layer micro-wire 55, and the top-layer micro-channel 21 formed by the third shallow protrusion 83 of the multi-level second stamp 82 extends over at least a portion of the third bottom-layer micro-wire 56 without contacting the third bottom-layer micro-wire 56.

Conductive ink is deposited in the first and second multi-layer micro-channels 41, 43 and the top-layer micro-channel 21 (step 530) and cured (step 535), forming an imprinted micro-wire structure 5 having a top-layer micro-wire 23 in the top-layer micro-channel 21 and first and second multi-layer micro-wires 31, 33 in the first and second multi-layer micro-channels 41, 43. In this embodiment, the top-layer micro-wire 23 corresponds to the bridge micro-wire 22 and the first and second multi-layer micro-wires 31, 33 correspond to the first and second connecting micro-wires 30, 32 of FIG. 1. The top-layer micro-wire 23 is electrically connected to the first and second multi-layer micro-wires 31, 33, to the first bottom-layer micro-wire 54, and to the second bottom-layer micro-wire 55 but not to the third bottom-layer micro-wire 56. Thus, the first bottom-layer micro-wire 54 is electrically connected to the second bottom-layer micro-wire 55 but is electrically isolated from the third bottom-layer micro-wire 56.

In one embodiment, the step 415 of forming the imprinted first multi-layer micro-channel 41 includes contacting the first bottom-layer micro-wire 54 with the first deep protrusion 81 of the multi-level second stamp 82. Alternatively, step 415 of forming the imprinted second multi-layer micro-channel 43 includes contacting the second bottom-layer micro-wire 55 with the second deep protrusion 81 of the multi-level second stamp 82.

Figure 11A:
FIGS. 11A-11I are cross sections illustrating sequential steps in an alternative method of the present invention that forms the multi-wire structure of FIG. 3.

In an alternative method, the structure illustrated in FIG. 3 is constructed. Referring to FIGS. 11A-11I and again to FIG. 15, a method of making an imprinted micro-wire structure 5 illustrated in FIG. 3 includes providing a substrate 10 (FIG. 11A) in step 100. A first stamp 88 (FIG. 11C) (corresponding to third stamp 87 of FIGS. 8K and 9C) and a different multi-level second stamp 89 (FIG. 11G) are provided in step 405, the multi-level second stamp 89 having at least first and second deep protrusions 81 and one or more third shallow protrusions 83, the first and second deep protrusions 81 having a deep protrusion depth 84 greater than a shallow protrusion depth 85 of the shallow protrusion(s) 83.

Figure 11B:
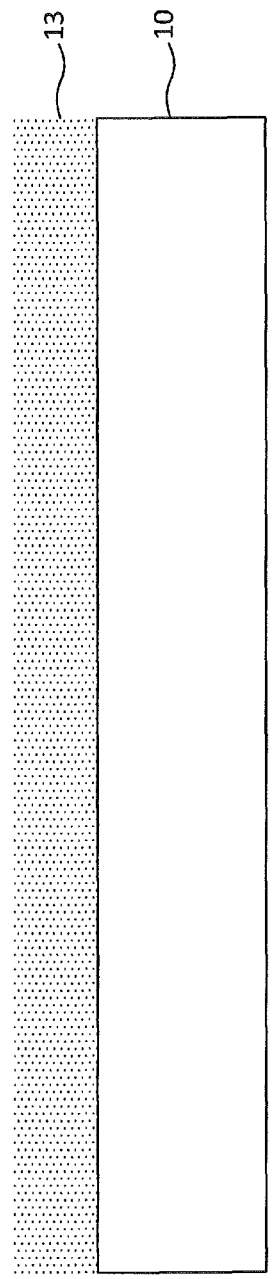
Figure 11C:
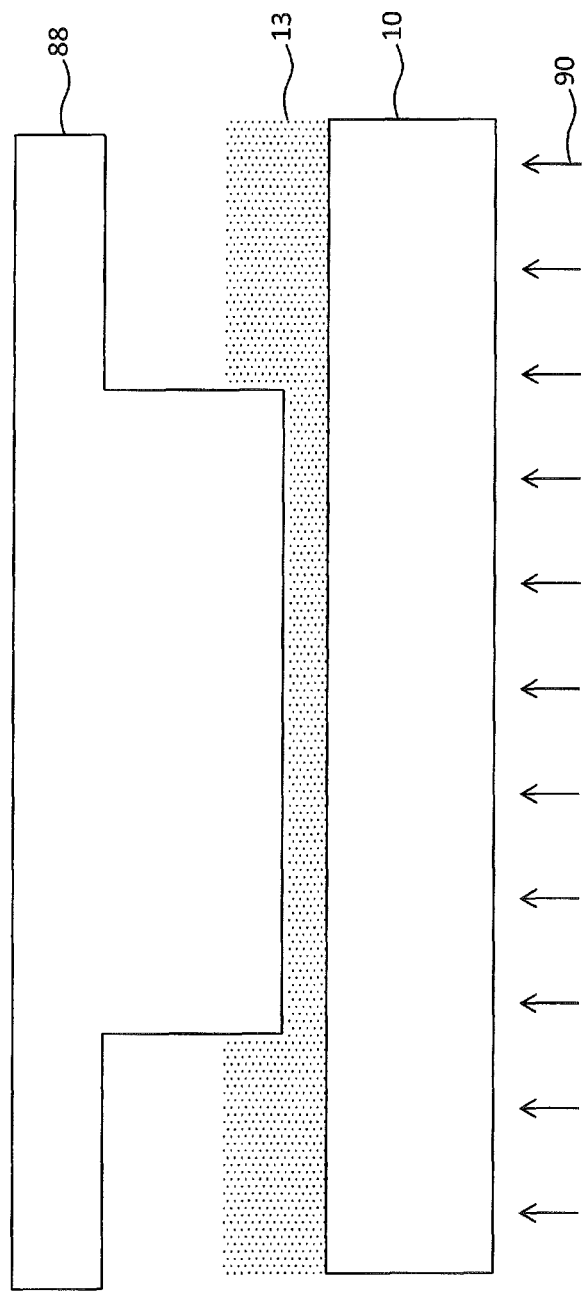
Figure 11D:
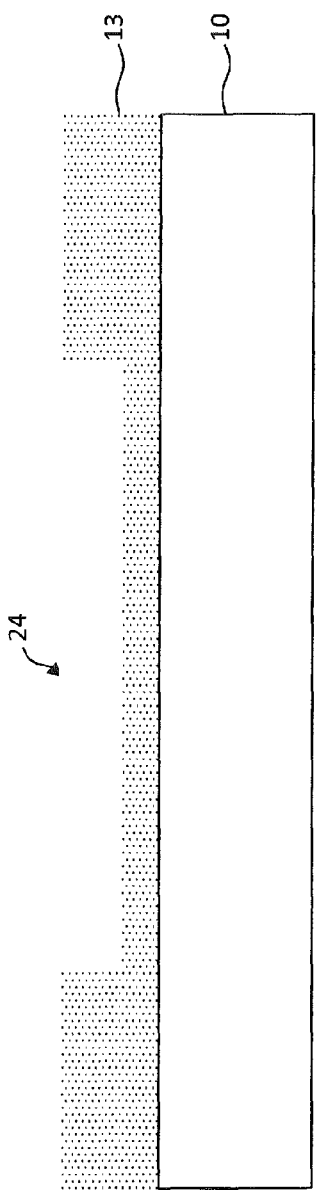

A curable bottom layer 13 is formed over the substrate 10 in step 410 (FIG. 11B). The bottom layer 13 corresponds to the third layer 16 of FIG. 3. The curable bottom layer 13 on the substrate 10 is imprinted with the first stamp 88 (step 415) and cured (step 420), for example with radiation 90, as illustrated in FIG. 11C to form one or more bottom-layer micro-channel(s) 24 in the curable bottom layer 13 on substrate 10 (FIG. 11D). In the embodiment of FIGS. 11A-11I, the bottom-layer micro-channel 24 corresponds to the bridge micro-channel 20 of FIG. 3.

Figure 11E:
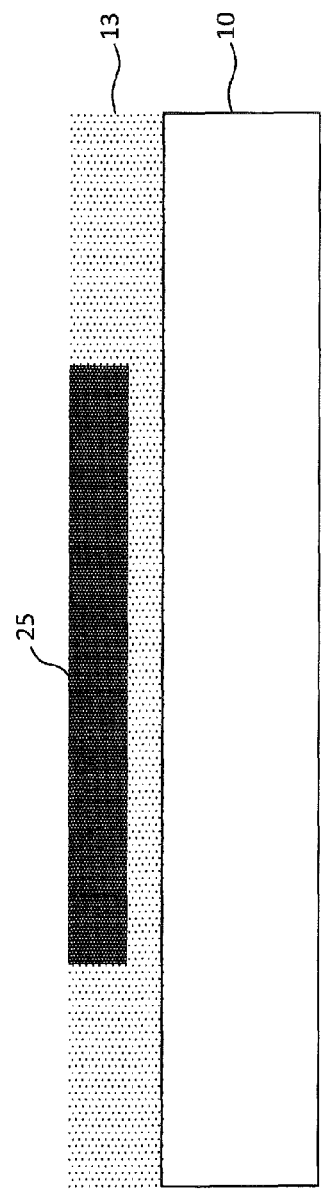
Figure 11F:
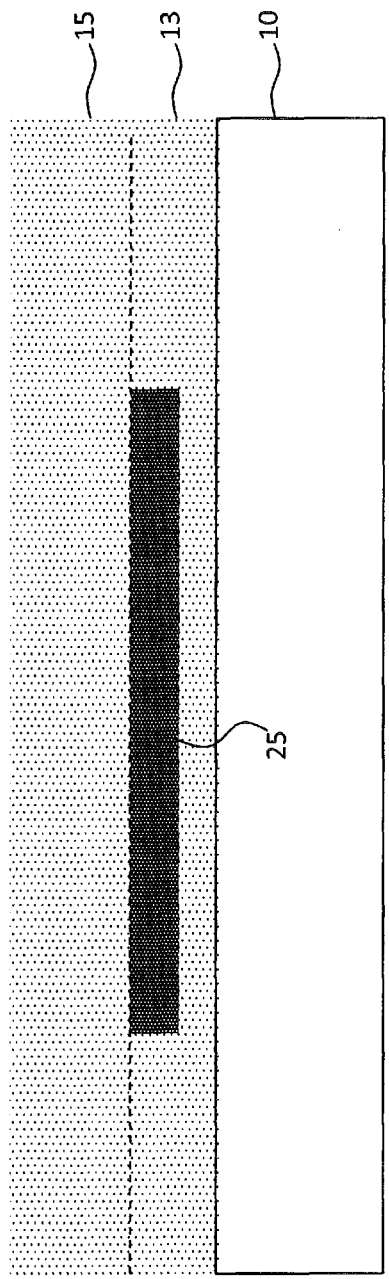
Figure 11G:
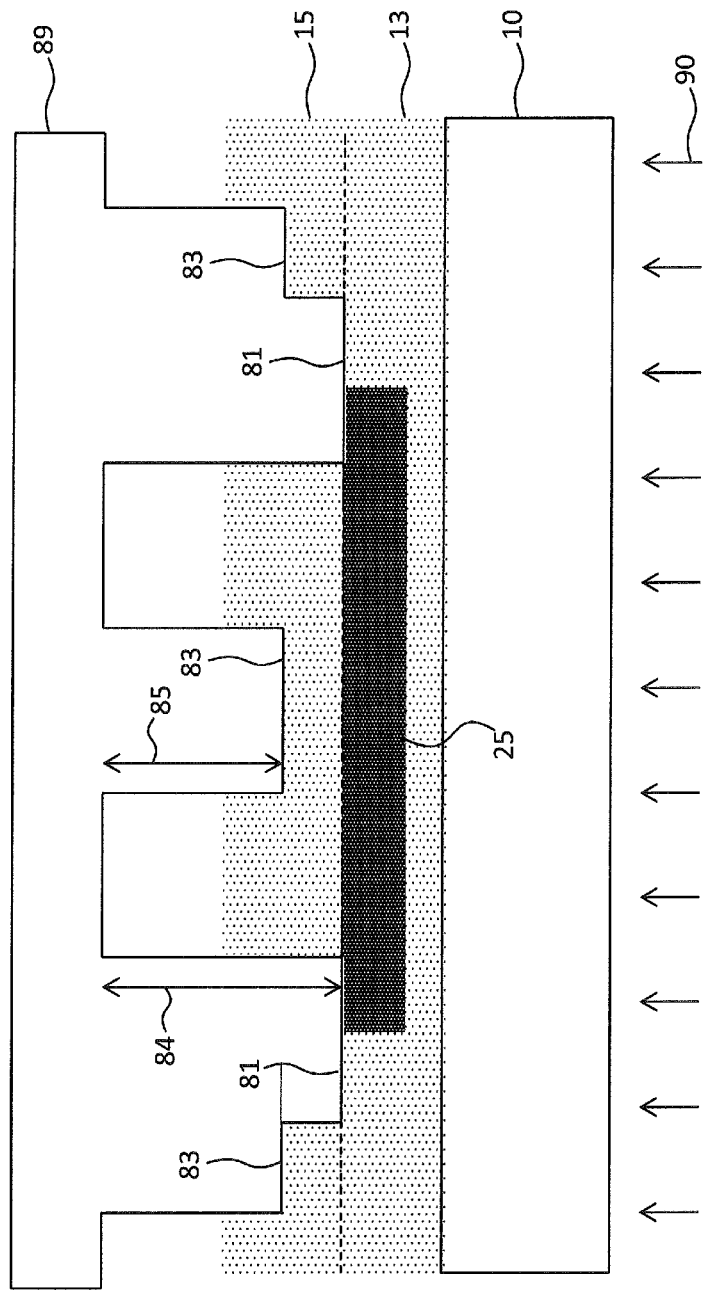

Conductive ink is deposited in the bottom-layer micro-channel(s) 24 (step 430) and cured (step 435), forming a bottom-layer micro-wire 25 in each bottom-layer micro-channel 24 in bottom layer 13 over the substrate 10 (FIG. 11E). In this embodiment, the bottom-layer micro-wire 25 corresponds to the bridge micro-wire 22 of FIG. 3.

A curable multi-layer 15 is formed adjacent to and in contact with the cured bottom layer 13 and the bottom-layer micro-wire(s) 25 over the substrate 10 in step 510 (FIG. 11F), for example by coating. In this embodiment, the multi-layer 15 is a combination of the second and first layers 14, 12 of FIG. 3, and the corresponding structures in second and first layers 14, 12 are made in common steps.

Figure 11H:
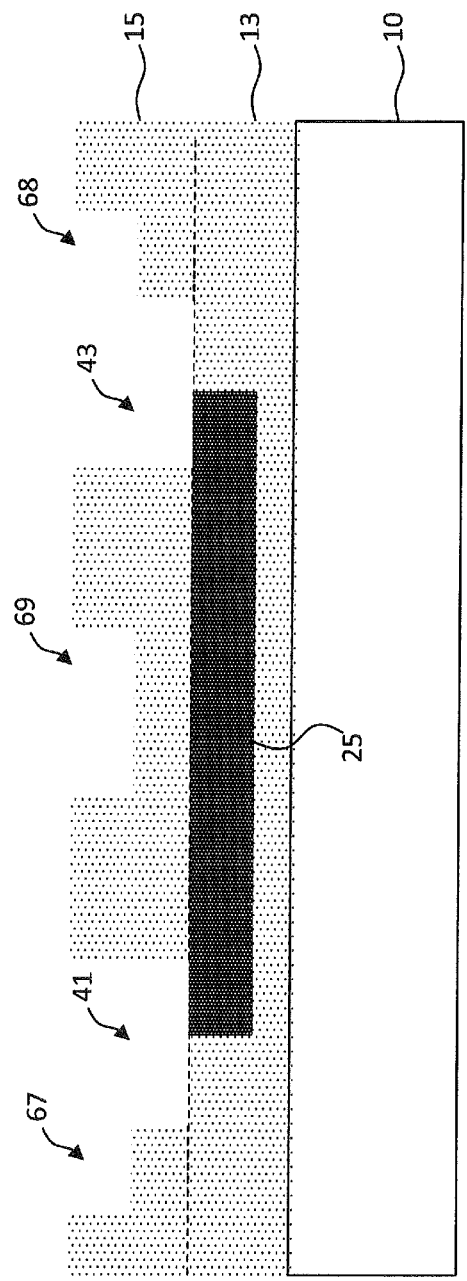

The curable multi-layer 15 is imprinted with the multi-level second stamp 89 in step 515 and cured in step 520 (FIG. 11G), for example with radiation 90. The imprinting is done over the bottom-layer micro-wire(s) 25 in the bottom layer 13 and over the substrate 10. Referring also to FIG. 11H, at least first and second multi-layer micro-channels 41, 43 and the first, second and third top-layer micro-channels 67, 68, 69 in the curable multi-layer 15 are formed by imprinting with the multi-level second stamp 89. In this embodiment, the first and second multi-layer micro-channels 41, 43 correspond to the first and second connecting micro-channels 40, 42 and the first, second and third top-layer micro-channels 67, 68, 69 correspond to the first, second, and third micro-channels 61, 62, 63 of FIG. 3.

The first multi-layer micro-channel 41 formed by the first deep protrusion 81 of the multi-level second stamp 89 is located over at least a portion of the bottom-layer micro-wire 25, a second multi-layer micro-channel 43 formed by the second deep protrusion 81 of the multi-level second stamp 82 is located over at least a different portion of the bottom micro-wire 25, and the third top-layer micro-channel 69 formed by the third shallow protrusion 83 of the multi-level second stamp 89 extends over at least a portion of the bottom-layer micro-wire 25 without contacting the bottom-layer micro-wire 25.

Figure 11I:
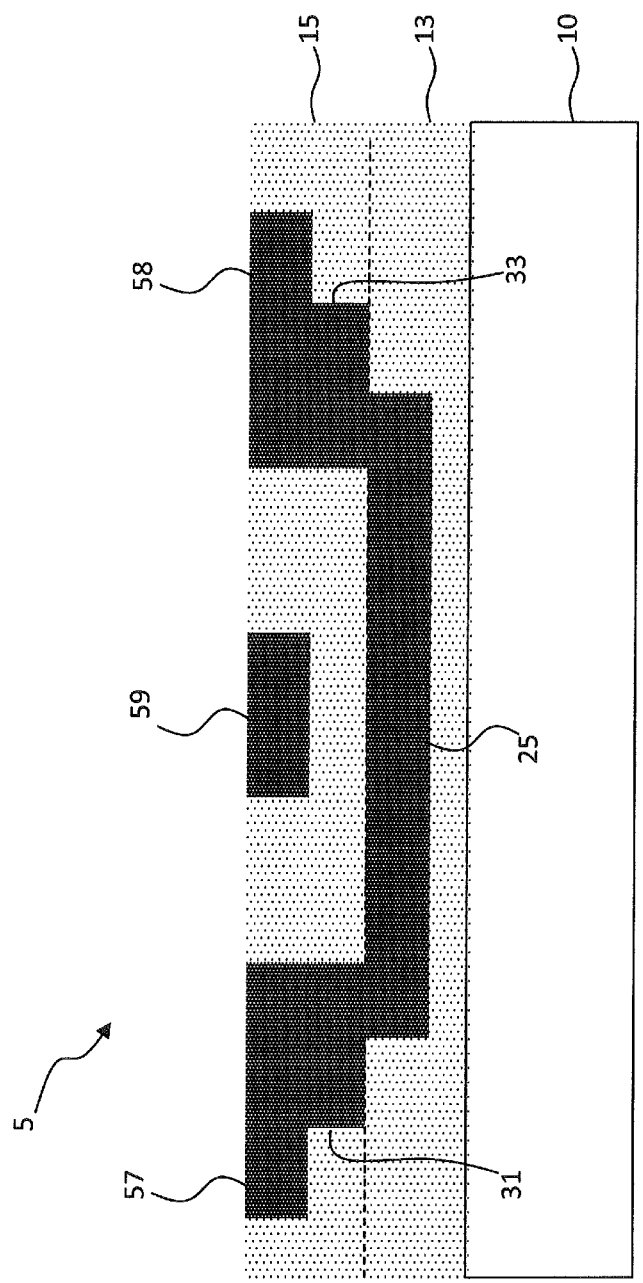

Conductive ink is deposited in the first and second multi-layer micro-channels 41, 43 and the first, second and third top-layer micro-channels 67, 68, 69 (step 530) and cured (step 535), forming an imprinted micro-wire structure 5 having first, second, and third top-layer micro-wires 57, 58, 59 in the first, second, and third top-layer micro-channels 67, 68, 69 and first and second multi-layer micro-wires 31, 33 in the first and second multi-layer micro-channels 41, 43, as shown in FIG. 11I. In this embodiment, the first, second, and third top-layer micro-wires 57, 58, 59 correspond to the first, second, and third micro-wires 51, 52, and 53 and the first and second multi-layer micro-wires 31, 33 correspond to the first and second connecting micro-wire 30, 32 of FIG. 3. The first and second top-layer micro-wires 57, 58 are electrically connected to the first and second multi-layer micro-wires 31, 33, respectively, and to the bottom micro-wire 25 but not to the third top-layer micro-wire 59. Thus, the first top-layer micro-wire 57 is electrically connected to the second top-layer micro-wire 58 but is electrically isolated from the third top-layer micro-wire 59.

In one embodiment, the step 415 of forming the imprinted first multi-layer micro-channel 41 includes contacting the bottom-layer micro-wire 25 with the first deep protrusion 81 of the multi-level second stamp 89. Alternatively, step 415 of forming the imprinted second multi-layer micro-channel 43 includes contacting the bottom-layer micro-wire 25 with the second deep protrusion 81 of the multi-level second stamp 89.

In a further embodiment of the present invention, at least additional first and second top-layer micro-channels 67, 68 are formed in the curable multi-layer 15 by at least imprinting the curable multi-layer 15 with the multi-level second stamp 89. The first top-layer micro-channel 67 is connected to the first multi-layer micro-channel 41 and the second top-layer micro-channel 68 is connected to the second multi-layer micro-channel 43. First and second top-layer micro-wires 57, 58 are formed in the first and second top-layer micro-channels 67, 68 and are electrically connected to the first and second multi-layer micro-wires 31, 33, respectively, and the bottom-layer micro-wire 25.

In further embodiments of the present invention relevant to both the structures and method of FIGS. 10A-10I and FIGS. 11A-11I, a portion of the cured multi-layer 15 is removed before the multi-layer 15 is coated, for example by treating (step 525) the portion of the cured multi-layer 15 with a plasma treatment, as discussed with respect to FIGS. 12A and 12B. The treatment can thin the entire cured multi-layer 15 by a thinning depth less than the deep-protrusion depth 84 of the deep protrusion minus the depth 85 of the shallow protrusion.

In other embodiments, the bottom layer 13 and multi-layer 15 include cross-linkable material and the cross-linkable first-layer material is cross-linked to the cross-linkable multi-layer material, for example by UV exposure to resins as is known in the art. Alternatively, the bottom layer 13 and multi-layer 15 include cross-linkable material and the cross-linkable first-layer material is cross-linked to the cross-linkable multi-layer material. Such cross-linking between the layers is accomplished when the curable bottom layer 13 includes first curable material and the first stamp 80, 88 is located in contact with the first curable material. The first curable material is at least partially cured so that when the curable multi-layer 15 includes second curable material and the multi-level second stamp 82, 89 is located in contact with the second curable material, the step of at least partially curing the second curable material can also at least partially cure the first material and cross link the first and second curable materials in a common step. Such partial curing of individual curable material layers followed by curing multiple curable material layers together can form a single indistinguishable or inseparable layer, especially when the first and second materials are the same material, thus providing a stronger and more robust layer structure.

In a further embodiment, conductive ink is deposited in the first and second multi-layer micro-channels 41, 43 and the top-layer micro-channels 21 or first, second, or third top-layer micro-channels 67, 68, 69 in a common step. In an alternative embodiment, conductive ink is deposited in the first, second, and third bottom-layer micro-channel(s) 64, 65, 66, or 24, first multi-layer micro-channel 41, second multi-layer micro-channel 43, or top-layer micro-channels 21, or first, second, or third top-layer micro-channels 67, 68, 69 a second time.

Furthermore, first conductive ink is deposited in the bottom-layer micro-channel(s) 24 or first, second, or third bottom-layer micro-channels 64, 65, 66 and at least partially cured. Second conductive ink is deposited in the first and second multi-layer micro-channels 41, 43 and the top-layer micro-channels 21 or first, second, or third top-layer micro-channels 67, 68, 69 and at least partially cured. The conductive ink in the bottom layer 13 is at least partially cured in a common step with the conductive ink in the first and second multi-layer micro-channels 41, 43.

The first and second conductive inks can each include electrically conductive particles. In a further embodiment, the electrically conductive particles in the second conductive ink are sintered, welded, or agglomerated to the electrically conductive particles in the first conductive ink, thus improving their conductivity and the electrical conductivity of the junctions between the different-layer micro-wires. Indeed, the micro-wires in the different layers can be considered as a common micro-wire.

In an embodiment, a cured-layer depth of the first layer 12, second layer 14, or third layer 16 has a range of about one micron to twenty microns and a cured-layer depth of the multi-layer 15 has a range of about 2 microns to 30 microns.

Cured first, second, third layer 12, 14, 16, or multi-layer 15 is a layer of curable material that has been cured and, for example, formed of a curable material coated or otherwise deposited on a surface, for example a surface of substrate 10, to form a curable layer. The substrate-coated curable material is considered herein to be a curable layer before it is cured and a cured layer after it is cured. Similarly, a cured electrical conductor is an electrical conductor formed by locating a curable material in a micro-channel and curing the curable material to form the cured electrical conductor in the micro-channel. The cured electrical conductor is a micro-wire.

In various embodiments, curable layers are deposited as a single layer in a single step using coating methods known in the art, e.g. curtain coating. In an alternative embodiment, curable layers are deposited as multiple sub-layers using multi-layer deposition methods known in the art, e.g. multi-layer slot coating, repeated curtain coatings, or multi-layer extrusion coating. In yet another embodiment, curable layers include multiple sub-layers formed in different, separate steps, for example with a multi-layer extrusion, curtain coating, or slot coating as is known in the coating arts. Micro-channels are embossed and cured in curable layers in a single step and micro-wires are formed by providing a curable conductive ink in micro-channels and curing the curable conductive ink to form an electrically conductive micro-wire.

Cured layers (e.g. first, second, or third layers 12, 14, 16, or multi-layer 15) useful in the present invention can include a cured polymer material with cross-linking agents that are sensitive to heat or radiation, for example infra-red, visible light, or ultra-violet radiation. The polymer material can be a curable material applied in a liquid form that hardens when the cross-linking agents are activated, for example with exposure to radiation or heat. When a molding device, such as the first stamp 80 or second multi-level stamp 82 having an inverse micro-channel structure is applied to liquid curable material in a curable layer coated on the substrate 10 and the cross-linking agents in the curable material are activated, the liquid curable material in the curable layer is hardened into a cured layer having micro-channels with the inverse structure of the stamp. The liquid curable materials can include a surfactant to assist in controlling coating. Materials, tools, and methods are known for embossing coated liquid curable materials to form cured layers having conventional single-layer micro-channels.

Similarly, curable inks useful in the present invention are known and can include conductive inks having electrically conductive nano-particles, such as silver nano-particles. The electrically conductive nano-particles can be metallic or have an electrically conductive shell. The electrically conductive nano-particles can be silver, can be a silver alloy, or can include silver.

Curable inks provided in a liquid form are deposited or located in micro-channels and cured, for example by heating or exposure to radiation such as infra-red, visible light, or ultra-violet radiation. The curable ink hardens to form the cured ink that makes up micro-wires. For example, a curable conductive ink with conductive nano-particles is located within micro-channels and heated to agglomerate or sinter the nano-particles, thereby forming an electrically conductive micro-wire. Materials, tools, and methods are known for coating liquid curable inks to form micro-wires in conventional single-layer micro-channels. The curable conductive ink is not necessarily electrically conductive before it is cured.

It has been experimentally demonstrated that micro-channels having a width of four microns formed in a cured layer with a depth in a range of about four microns to twelve microns over a conductive layer can be filled with liquid curable conductive inks containing silver nano-particles and cured with heat to form micro-wires that conduct-electricity to the conductive layer, thus enabling electrical conduction between separate micro-wires in a cured layer. Oxygen plasmas that thin the cured layer by two to eight microns have been shown to enable the formation of micro-wires that are in electrical contact with the underlying conductive layer. It has also been experimentally demonstrated that micro-wires formed in a micro-channel in a bottom layer can be contacted with a micro-wire formed in a micro-channel in a layer coated over the bottom layer to form an electrically continuous conductive micro-structure.

Electrical connectors or other micro-wires can be electrically connected to micro-wires formed in the first layer 12, third layer 16, or multi-layer 15.

According to various embodiments of the present invention, substrate 10 is any material having a surface on which a cured layer can be formed. Substrate 10 can be a rigid or a flexible substrate made of, for example, a glass, metal, plastic, or polymer material, can be transparent, and can have opposing substantially parallel and extensive surfaces. Substrates 10 can include a dielectric material useful for capacitive touch screens and can have a wide variety of thicknesses, for example 10 microns, 50 microns, 100 microns, 1 mm, or more. In various embodiments of the present invention, substrates 10 are provided as a separate structure or are coated on another underlying substrate, for example by coating a polymer substrate layer on an underlying glass substrate.

Substrate 10 can be an element of other devices, for example the cover or substrate of a display or a substrate, cover, or dielectric layer of a touch screen. In an embodiment, a substrate 10 of the present invention is large enough for a user to directly interact therewith, for example using an implement such as a stylus or using a finger or hand. Methods are known in the art for providing suitable surfaces on which to coat a single curable layer. In a useful embodiment, substrate 10 is substantially transparent, for example having a transparency of greater than 90%, 80% 70% or 50% in the visible range of electromagnetic radiation.

Electrically conductive micro-wires and methods of the present invention are useful for making electrical conductors and busses for transparent micro-wire electrodes and electrical conductors in general, for example as used in electrical busses. A variety of micro-wire or micro-channel patterns can be used and the present invention is not limited to any one pattern. Micro-wires can be spaced apart, form separate electrical conductors, or intersect to form a mesh electrical conductor on or in a layer. Micro-channels can be identical or have different sizes, aspect ratios, or shapes. Similarly, micro-wires can be identical or have different sizes, aspect ratios, or shapes. Micro-wires can be straight or curved.

In some embodiments, a micro-channel is a groove, trench, or channel formed in a cured layer and having a cross-sectional width less than 20 microns, for example 10 microns, 5 microns, 4 microns, 3 microns, 2 microns, 1 micron, or 0.5 microns, or less. In an embodiment, a micro-channel depth is comparable to a micro-channel width. Micro-channels can have a rectangular cross section, as shown in the Figures. Other cross-sectional shapes, for example trapezoids, are known and are included in the present invention. The width or depth of a layer is measured in cross section.

In various embodiments, cured inks can include metal particles, for example nano-particles. The metal particles can be sintered to form a metallic electrical conductor. The metal nano-particles can be silver or a silver alloy or other metals, such as tin, tantalum, titanium, gold, copper, or aluminum, or alloys thereof. Cured inks can include light-absorbing materials such as carbon black, a dye, or a pigment.

In an embodiment, a curable ink can include conductive nano-particles in a liquid carrier (for example an aqueous solution including surfactants that reduce flocculation of metal particles, humectants, thickeners, adhesives or other active chemicals). The liquid carrier can be located in micro-channels and heated or dried to remove liquid carrier or treated with hydrochloric acid, leaving a porous assemblage of conductive particles that can be agglomerated or sintered to form a porous electrical conductor in a layer. Thus, in an embodiment, curable inks are processed to change their material compositions, for example, conductive particles in a liquid carrier are not electrically conductive, but after processing form an assemblage that is electrically conductive.

Once deposited, the conductive inks are cured, for example by heating. The curing process drives out the liquid carrier and sinters the metal particles to form a metallic electrical conductor. Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in the micro-wire formation process.

In various embodiments of the present invention, micro-channels or micro-wires have a width less than or equal to 10 microns, 5 microns, 4 microns, 3 microns, 2 microns, or 1 micron. In an example and non-limiting embodiment of the present invention, each micro-wire is from 10 to 15 microns wide, from 5 to 10 microns wide, or from 5 microns to one micron wide. In some embodiments, micro-wires can fill micro-channels; in other embodiments micro-wires do not fill micro-channels. In an embodiment, micro-wires are solid; in another embodiment micro-wires are porous.

Micro-wires can be metal, for example silver, gold, aluminum, nickel, tungsten, titanium, tin, or copper or various metal alloys including, for example silver, gold, aluminum, nickel, tungsten, titanium, tin, or copper. Micro-wires can include a thin metal layer composed of highly conductive metals such as gold, silver, copper, or aluminum. Other conductive metals or materials can be used. Alternatively, micro-wires can include cured or sintered metal particles such as nickel, tungsten, silver, gold, titanium, or tin or alloys such as nickel, tungsten, silver, gold, titanium, or tin. Conductive inks can be used to form micro-wires with pattern-wise deposition or pattern-wise formation followed by curing steps. Other materials or methods for forming micro-wires, such as curable ink powders including metallic nano-particles, can be employed and are included in the present invention.

Electrically conductive micro-wires of the present invention can be operated by electrically connecting micro-wires through connection pads and electrical connectors to electrical circuits that provide electrical current to micro-wires and can control the electrical behavior of micro-wires. Electrically conductive micro-wires of the present invention are useful, for example in touch screens such as projected-capacitive touch screens that use transparent micro-wire electrodes and in displays. Electrically conductive micro-wires can be located in areas other than display areas, for example in the perimeter of the display area of a touch screen, where the display area is the area through which a user views a display.

Methods and devices for forming and providing substrates and coating substrates are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are well known. These tools and methods can be usefully employed to design, implement, construct, and operate the present invention. Methods, tools, and devices for operating capacitive touch screens can be used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

D1 direction
D2 direction
5 imprinted micro-wire structure
10 substrate
12 first layer
13 bottom layer
14 second layer
15 multi-layer
16 third layer
20 bridge micro-channel
21 top-layer micro-channel
22 bridge micro-wire
23 top-layer micro-wire
24 bottom-layer micro-channel
25 bottom-layer micro-wire
30 first connecting micro-wire
31 first multi-layer micro-wire
32 second connecting micro-wire
33 second multi-layer micro-wire
40 first connecting micro-channel
41 first multi-layer micro-channel
42 second connecting micro-channel
43 second multi-layer micro-channel
51 first micro-wire
52 second micro-wire
53 third micro-wire
54 first bottom-layer micro-wire
55 second bottom-layer micro-wire
56 third bottom-layer micro-wire
57 first top-layer micro-wire
58 second top-layer micro-wire
59 third top-layer micro-wire
61 first micro-channel
62 second micro-channel
63 third micro-channel
64 first bottom-layer micro-channel
65 second bottom-layer micro-channel
66 third bottom-layer micro-channel
67 first top-layer micro-channel
68 second top-layer micro-channel
69 third top-layer micro-channel
70 first portion
72 second portion
74 line
78 protrusion
80 first stamp
81 deep protrusion
82 multi-level second stamp 83 shallow protrusion
84 deep-protrusion depth
85 shallow-protrusion depth
86 second stamp
87 third stamp
88 first stamp
89 multi-level second stamp
90 radiation
92 plasma
94 thinning depth
100 provide substrate step
105 provide stamps step
110 provide first layer step
115 imprint first-layer micro-channels step
120 cure first-layer micro-channels step
125 optional plasma-treat first-layer micro-channels step
130 provide conductive ink in first-layer micro-channels step
135 cure conductive ink in first-layer micro-channels step
210 provide second layer step
215 imprint second-layer micro-channels step
220 cure second-layer micro-channels step
225 optional plasma-treat second-layer micro-channels step
230 provide conductive ink in second-layer micro-channels step
235 cure conductive ink in second-layer micro-channels step
310 provide third layer step
315 imprint third-layer micro-channels step
320 cure third-layer micro-channels step
325 optional plasma-treat third-layer micro-channels step
330 provide conductive ink in third-layer micro-channels step
335 cure conductive ink in third-layer micro-channels step
405 provide stamps step
410 form bottom layer step
415 imprint bottom-layer micro-channels step
420 cure bottom-layer micro-channels step
425 optional plasma-treat bottom-layer micro-channels step
430 deposit conductive ink in bottom-layer micro-channels step
435 cure conductive ink in bottom-layer micro-channels step
510 form multi-layer step
515 imprint multi-layer micro-channels with multi-level stamp step
520 cure multi-layer micro-channels step
525 optional plasma-treat multi-layer micro-channels step
530 deposit conductive ink in multi-layer micro-channels step
535 cure conductive ink in multi-layer micro-channels step

The invention claimed is:

1. A method of making an imprinted micro-wire structure, comprising:
providing a substrate;
providing a first stamp and a different multi-level second stamp having at least first and second deep protrusions and one or more third shallow protrusions, the first and second deep protrusions having a depth greater than a depth of the shallow protrusion(s);
providing a curable bottom layer over the substrate, wherein the curable bottom layer includes first curable material and further including locating the first stamp in contact with the first curable material and only partially curing the first curable material or wherein the curable multi-layer includes second curable material and further including locating the multi-level second stamp in contact with the second curable material and only partially curing the second curable material;
forming one or more bottom-layer micro-channel(s) in the curable bottom layer by at least imprinting the curable bottom layer with the first stamp and curing the curable bottom layer;
forming a bottom-layer micro-wire in each bottom-layer micro-channel;
providing a curable multi-layer adjacent to and in contact with the cured bottom layer;
forming at least first and second multi-layer micro-channels in a common layer and a top-layer micro-channel in the curable multi-layer in a common step by at least imprinting the curable multi-layer with the multi-level second stamp and curing the curable multi-layer, wherein either:
i) the first multi-layer micro-channel formed by the first deep protrusion is located over at least a portion of a first bottom-layer micro-wire, a second multi-layer micro-channel formed by the second deep protrusion is located over at least a portion of a second bottom-layer micro-wire, and the top-layer micro-channel formed by the third shallow protrusion extends over at least a portion of a third bottom-layer micro-wire without contacting the third bottom-layer micro-wire; or
ii) the first multi-layer micro-channel formed by the first deep protrusion is located over at least a portion of a bottom-layer micro-wire, a second multi-layer micro-channel formed by the second deep protrusion is located over at least a different portion of the bottom-layer micro-wire, and the top-layer micro-channel formed by the third shallow protrusion extends over at least a portion of the bottom-layer micro-wire without contacting the bottom-layer micro-wire; and
forming a top-layer micro-wire in the top-layer micro-channel, a first multi-layer micro-wire in the first multi-layer micro-channel, and a second multi-layer micro-wire in the second multi-layer micro-channel that electrically connects the first multi-layer micro-wire to the second multi-layer micro-wire.

2. The method of claim 1, wherein the first and second multi-layer micro-wires are electrically connected through the top-layer micro-wire and are electrically isolated from the third bottom-layer micro-wire.

3. The method of claim 1, wherein the step of forming the imprinted first multi-layer micro-channel further includes contacting the first bottom-layer micro-wire with the first deep protrusion of the multi-level second stamp or wherein the step of forming the imprinted second multi-layer micro-channel further includes contacting the second bottom-layer micro-wire with the second deep protrusion of the multi-level second stamp.

4. The method of claim 1, wherein the bottom layer and multi-layer include cross-linkable material and further including cross linking the cross-linkable first-layer material to the cross-linkable multi-layer material.

5. The method of claim 1, further including at least partially curing the curable bottom layer and the curable multi-layer in a common step.

6. The method of claim 1, wherein the top-layer micro-channel physically connects the first multi-layer micro-channel to the second micro-layer micro-channel.

7. The method of claim 1, wherein the bottom-layer micro-channel physically connects the first multi-layer micro-channel to the second micro-layer micro-channel.

8. The method of claim 1, wherein the first and second multi-layer micro-wires are electrically connected through the bottom-layer micro-wire and are electrically isolated from the top-layer micro-wire.

9. The method of claim 8, further including forming at least additional first and second top-layer micro-channels in the curable multi-layer by at least imprinting the curable multi-layer with the multi-level second stamp, the additional first top-layer micro-channel connected to the first multi-layer micro-channel, the second additional top-layer micro-channel connected to the second multi-layer micro-channel, and forming additional first and second top-layer micro-wires in the additional first and second top-layer micro-channels electrically connected to the first and second multi-layer micro-wires, respectively.

10. The method of claim 1, further including removing a portion of the cured multi-layer.

11. The method of claim 10, further including removing the portion of the cured multi-layer by treating the cured layer with a plasma treatment.

12. The method of claim 10, further including treating the multi-layer to thin the entire cured multi-layer by a thinning depth.

13. The method of claim 12, wherein the thinning depth is less than the depth of the deep protrusion minus the depth of the shallow protrusion.

14. A method of making an imprinted micro-wire structure, comprising:
providing a substrate;
providing a first stamp and a different multi-level second stamp having at least first and second deep protrusions and one or more third shallow protrusions, the first and second deep protrusions having a depth greater than a depth of the shallow protrusion(s);
providing a curable bottom layer over the substrate;
forming one or more bottom-layer micro-channel(s) in the curable bottom layer by at least imprinting the curable bottom layer with the first stamp and curing the curable bottom layer;
forming a bottom-layer micro-wire in each bottom-layer micro-channel;
providing a curable multi-layer adjacent to and in contact with the cured bottom layer;
forming at least first and second multi-layer micro-channels and a top-layer micro-channel in the curable multi-layer by at least imprinting the curable multi-layer with the multi-level second stamp and curing the curable multi-layer, wherein either:
i) the first multi-layer micro-channel formed by the first deep protrusion is located over at least a portion of a first bottom-layer micro-wire, a second multi-layer micro-channel formed by the second deep protrusion is located over at least a portion of a second bottom-layer micro-wire, and the top-layer micro-channel formed by the third shallow protrusion extends over at least a portion of a third bottom-layer micro-wire without contacting the third bottom-layer micro-wire; or
ii) the first multi-layer micro-channel formed by the first deep protrusion is located over at least a portion of a bottom-layer micro-wire, a second multi-layer micro-channel formed by the second deep protrusion is located over at least a different portion of the bottom-layer micro-wire, and the top-layer micro-channel formed by the third shallow protrusion extends over at least a portion of the bottom-layer micro-wire without contacting the bottom-layer micro-wire;
forming a top-layer micro-wire in the top-layer micro-channel, a first multi-layer micro-wire in the first multi-layer micro-channel, and a second multi-layer micro-wire in the second multi-layer micro-channel that electrically connects the first multi-layer micro-wire to the second multi-layer micro-wire; and
further including providing first conductive ink in the bottom-layer micro-channel(s) and only partially curing the first conductive ink, providing second conductive ink in the first and second multi-layer micro-channels and top-layer micro-channel and at least partially curing the second conductive ink.

15. The method of claim 14, further including providing conductive ink in the bottom-layer micro-channel(s), first multi-layer micro-channel, second multi-layer micro-channel, or top micro-channel a second time.

16. The method of claim 14, further including at least partially curing the first conductive ink and the second conductive ink in a common step.

17. The method of claim 14, wherein the first and second conductive inks each include electrically conductive particles and further including sintering, welding, or agglomerating the electrically conductive particles in the second conductive ink to the electrically conductive particles in the first conductive ink.

18. A method of making an imprinted micro-wire structure, comprising:
providing a substrate;
providing a first stamp and a different multi-level second stamp having at least first and second deep protrusions and one or more third shallow protrusions, the first and second deep protrusions having a depth greater than a depth of the shallow protrusion(s);
providing a curable bottom layer over the substrate;
forming one or more bottom-layer micro-channel(s) in the curable bottom layer by at least imprinting the curable bottom layer with the first stamp and curing the curable bottom layer;
forming a bottom-layer micro-wire in each bottom-layer micro-channel;
providing a curable multi-layer adjacent to and in contact with the cured bottom layer;
forming at least first and second multi-layer micro-channels and a top-layer micro-channel in the curable multi-layer by at least imprinting the curable multi-layer with the multi-level second stamp and curing the curable multi-layer, wherein either:
i) the first multi-layer micro-channel formed by the first deep protrusion is located over at least a portion of a first bottom-layer micro-wire, a second multi-layer micro-channel formed by the second deep protrusion is located over at least a portion of a second bottom-layer micro-wire, and the top-layer micro-channel formed by the third shallow protrusion extends over at least a portion of a third bottom-layer micro-wire without contacting the third bottom-layer micro-wire; or
ii) the first multi-layer micro-channel formed by the first deep protrusion is located over at least a portion of a bottom-layer micro-wire, a second multi-layer micro-channel formed by the second deep protrusion is located over at least a different portion of the bottom-layer micro-wire, and the top-layer micro-channel formed by the third shallow protrusion extends over at least a portion of the bottom-layer micro-wire without contacting the bottom-layer micro-wire;

forming a top-layer micro-wire in the top-layer micro-channel, a first multi-layer micro-wire in the first multi-layer micro-channel, and a second multi-layer micro-wire in the second multi-layer micro-channel that electrically connects the first multi-layer micro-wire to the second multi-layer micro-wire; and further including providing conductive ink in the first and second multi-layer micro-channels and top-layer micro-channel in a common step.

\* \* \* \* \*